US010283666B2

(12) United States Patent
Ahmari et al.

(10) Patent No.: US 10,283,666 B2
(45) Date of Patent: May 7, 2019

(54) MANUFACTURING SEMICONDUCTOR-BASED MULTI-JUNCTION PHOTOVOLTAIC DEVICES

(71) Applicant: EpiWorks, Inc., Champaign, IL (US)

(72) Inventors: David Ahmari, Champaign, IL (US); Swee Lim, Champaign, IL (US); Shiva Rai, Champaign, IL (US); David Forbes, Medina, OH (US)

(73) Assignee: EpiWorks, Inc., Champaign, IL (US)

( * ) Notice: Subject to any disclaimer, the term of this patent is extended or adjusted under 35 U.S.C. 154(b) by 0 days.

(21) Appl. No.: 15/680,426

(22) Filed: Aug. 18, 2017

(65) Prior Publication Data
US 2017/0345962 A1    Nov. 30, 2017

Related U.S. Application Data

(63) Continuation of application No. 14/577,676, filed on Dec. 19, 2014, now Pat. No. 9,972,737, which is a
(Continued)

(51) Int. Cl.
H01L 31/0725    (2012.01)
H01L 31/18    (2006.01)
(Continued)

(52) U.S. Cl.
CPC .......... H01L 31/18 (2013.01); H01L 31/0336 (2013.01); H01L 31/065 (2013.01);
(Continued)

(58) Field of Classification Search
None
See application file for complete search history.

(56) References Cited

U.S. PATENT DOCUMENTS 6,815,736 B2    11/2004  Mascarenhas
7,148,417 B1    12/2006  Landis
(Continued)

FOREIGN PATENT DOCUMENTS

CN    1780004 A    5/2006
CN    101246926 A    8/2008
(Continued)

OTHER PUBLICATIONS

Geisz et al., "Lattice-Matched GaNPAs-on-Silicon Tandem Solar Cells" Conf Rec IEEE Photovoltaic Spec Conf, Jan. 3, 2005, pp. 1-4.
(Continued)

Primary Examiner — Minh Loan Tran
(74) Attorney, Agent, or Firm — Banner & Witcoff, Ltd.

(57) ABSTRACT

Manufacture of multi-junction solar cells, and devices thereof, are disclosed. The architectures are also adapted to provide for a more uniform and consistent fabrication of the solar cell structures, leading to improved yields, greater efficiency, and lower costs. Certain solar cells may be from a different manufacturing process and further include one or more compositional gradients of one or more semiconductor elements in one or more semiconductor layers, resulting in a more optimal solar cell device. A multi-junction cell may include a back surface field layer, a tunneling junction layer, a first active cell, and a second active cell.

18 Claims, 17 Drawing Sheets

Related U.S. Application Data continuation of application No. 13/924,242, filed on Jun. 21, 2013, now Pat. No. 8,951,827.

(60) Provisional application No. 61/718,708, filed on Oct. 26, 2012, provisional application No. 61/663,374, filed on Jun. 22, 2012.

(51) Int. Cl.

| | | |
|---|---|---|
| *H01L 31/072* | (2012.01) | |
| *H01L 31/076* | (2012.01) | |
| *H01L 31/0735* | (2012.01) | |
| *H01L 31/0687* | (2012.01) | |
| *H01L 31/0336* | (2006.01) | |
| *H01L 31/065* | (2012.01) | |

(52) U.S. Cl.
CPC .... *H01L 31/0687* (2013.01); *H01L 31/06875* (2013.01); *H01L 31/072* (2013.01); *H01L 31/076* (2013.01); *H01L 31/0725* (2013.01); *H01L 31/0735* (2013.01); *H01L 31/1852* (2013.01); *Y02E 10/544* (2013.01); *Y02P 70/521* (2015.11)

(56) References Cited

U.S. PATENT DOCUMENTS

| | | |
|---|---|---|
| 8,067,687 B2 | 11/2011 | Wanlass |
| 8,299,351 B2 | 10/2012 | Hsu |
| 9,029,693 B2 | 5/2015 | Yi |
| 9,117,948 B1 | 8/2015 | Landis |
| 2004/0200523 A1 | 10/2004 | King et al. |
| 2004/0261837 A1 | 12/2004 | Friedman et al. |
| 2009/0173373 A1 | 7/2009 | Walukiewicz et al. |
| 2010/0212729 A1 | 8/2010 | Hsu |
| 2010/0282307 A1 | 11/2010 | Sharps et al. |
| 2010/0319764 A1 | 12/2010 | Wiemer et al. |
| 2011/0120538 A1 | 5/2011 | Lochtefeld et al. |
| 2011/0124146 A1 | 5/2011 | Pitera et al. |
| 2011/0132447 A1 | 6/2011 | Lin et al. |
| 2011/0139227 A1 | 6/2011 | Sivananthan et al. |
| 2011/0278537 A1 | 11/2011 | Lee et al. |
| 2014/0196774 A1 | 7/2014 | Bedell et al. |

FOREIGN PATENT DOCUMENTS

| | | |
|---|---|---|
| CN | 101911312 A | 12/2010 |
| CN | 102097541 A | 6/2011 |
| CN | 102122675 A | 7/2011 |
| CN | 102341913 A | 2/2012 |
| CN | 102386251 A | 3/2012 |
| JP | H03290925 A | 12/1991 |
| JP | 2001102608 A | 4/2001 |
| JP | 2003152205 A | 5/2003 |
| JP | 2006216968 A | 8/2006 |
| JP | 2010108979 A | 5/2010 |
| JP | 2010199034 A | 9/2010 |
| WO | 2010107522 A1 | 9/2010 |

OTHER PUBLICATIONS

Yang, M. et al., "High Efficiency Monolithic GaAs/Si Tandem Solar Cells Grown by MOCVD", Proc of 1994 IEEE 1st World Conference on Photovoltaic Energy Conversion, 1994, pp. 1-4.
Nov. 28, 2017—(JP) Office Action—App. 2017-198319 with English Translation.
International Search Report and Written Opinion for PCT/US2013/047127 filed on Jun. 21, 2013.
Mar. 29, 2016—(EP) Supplementary European Search Report—App 13 80 6347.
Feb. 29, 2016—(CN) First Office Action—App 2013800425787—Eng Tran.
Jan. 28, 2019—(CN) Office Action—App 2017107052335.

100T1-1

| Third Cell 140C Bandgap (eV) | Second Cell 140B Bandgap (eV) | | | | | | | |
|---|---|---|---|---|---|---|---|---|
| | 1.20 | 1.30 | 1.40 | 1.50 | 1.60 | 1.70 | 1.80 | 1.90 |
| 2.30 | 30.1% | 30.9% | 31.8% | 32.6% | 33.5% | 34.3% | 35.2% | 32.1% |
| 2.20 | 34.9% | 35.9% | 36.9% | 37.9% | 38.9% | 39.9% | 34.2% | 24.6% |
| 2.10 | 39.8% | 41.0% | 42.2% | 43.3% | 44.5% | 35.7% | 26.4% | 16.9% |
| 2.00 | 45.2% | 46.6% | 47.9% | 47.7% | 37.2% | 27.3% | 18.1% | 8.8% |
| 1.90 | 43.8% | 45.2% | 46.5% | 46.4% | 36.2% | 26.6% | 17.6% | |
| 1.80 | 42.4% | 43.8% | 45.2% | 45.0% | 35.2% | 25.9% | | |
| 1.70 | 41.0% | 42.0% | 43.8% | 43.7% | 34.1% | | | |
| 1.60 | 39.7% | 41.0% | 42.4% | 42.4% | | | | |

| Top Cell Bandgap (eV) | Efficiency (%) |
|---|---|
| 2.26 | 24% |
| 2.21 | 26% |
| 2.16 | 28% |
| 2.11 | 29% |
| 2.06 | 31% |
| 2.01 | 33% |
| 1.96 | 35% |
| 1.91 | 37% |
| 1.86 | 39% |
| 1.81 | 41% |
| 1.76 | 43% |
| 1.71 | 44% |
| 1.66 | 43% |
| 1.61 | 42% |
| 1.56 | 41% |
| 1.51 | 40% |
| 1.46 | 39% |
| 1.41 | 38% |
| 1.36 | 37% |
| 1.31 | 36% |

| Third Cell 140C Bandgap (eV) | Second Cell 140B Bandgap (eV) | | | | | | | |
|---|---|---|---|---|---|---|---|---|
| | 1.20 | 1.30 | 1.40 | 1.50 | 1.60 | 1.70 | 1.80 | 1.90 |
| 2.30 | 10.0% | 21.6% | 24.0% | 24.7% | 25.4% | 26.1% | 26.9% | 24.9% |
| 2.20 | 9.7% | 20.9% | 27.1% | 28.4% | 29.3% | 30.1% | 26.6% | 19.2% |
| 2.10 | 9.4% | 20.3% | 28.8% | 32.5% | 32.7% | 28.0% | 20.5% | 13.2% |
| 2.00 | 9.1% | 19.6% | 27.7% | 34.8% | 28.8% | 21.3% | 14.0% | 6.7% |
| 1.90 | 8.7% | 19.0% | 26.8% | 29.9% | 21.9% | 14.5% | 7.2% | |
| 1.80 | 8.4% | 18.3% | 25.9% | 22.5% | 14.6% | 7.3% | | |
| 1.70 | 8.1% | 17.7% | 23.2% | 15.2% | 7.3% | | | |
| 1.60 | 7.8% | 17.0% | 16.1% | 7.8% | | | | |

FIG. 1E (100T2-2)

| Top Cell Bandgap (eV) | Efficiency (%) |
|---|---|
| 2.26 | 18% |
| 2.21 | 19% |
| 2.16 | 20% |
| 2.11 | 21% |
| 2.06 | 23% |
| 2.01 | 24% |
| 1.96 | 25% |
| 1.91 | 27% |
| 1.86 | 28% |
| 1.81 | 30% |
| 1.76 | 31% |
| 1.71 | 31% |
| 1.66 | 31% |
| 1.61 | 27% |
| 1.56 | 24% |
| 1.51 | 21% |
| 1.46 | 18% |
| 1.41 | 15% |
| 1.36 | 12% |
| 1.31 | 10% |

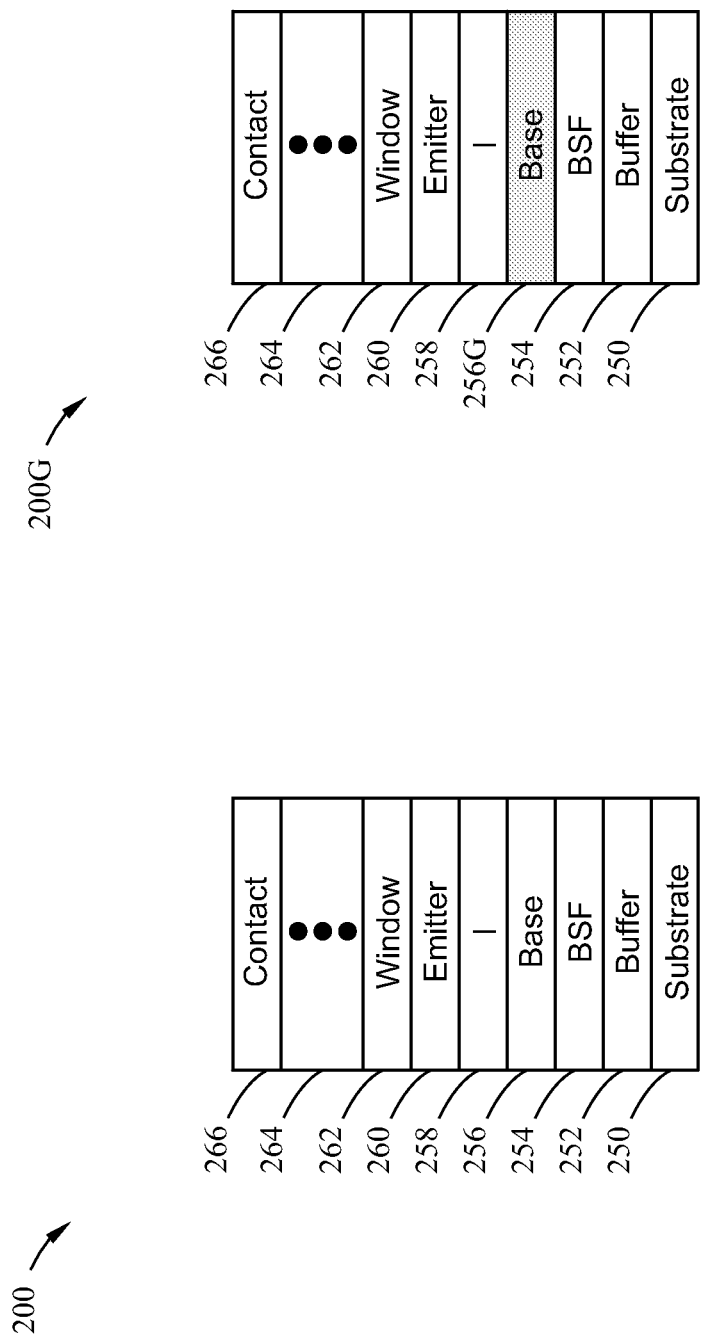

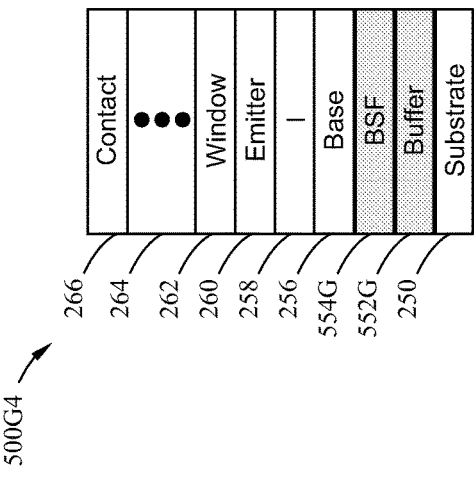
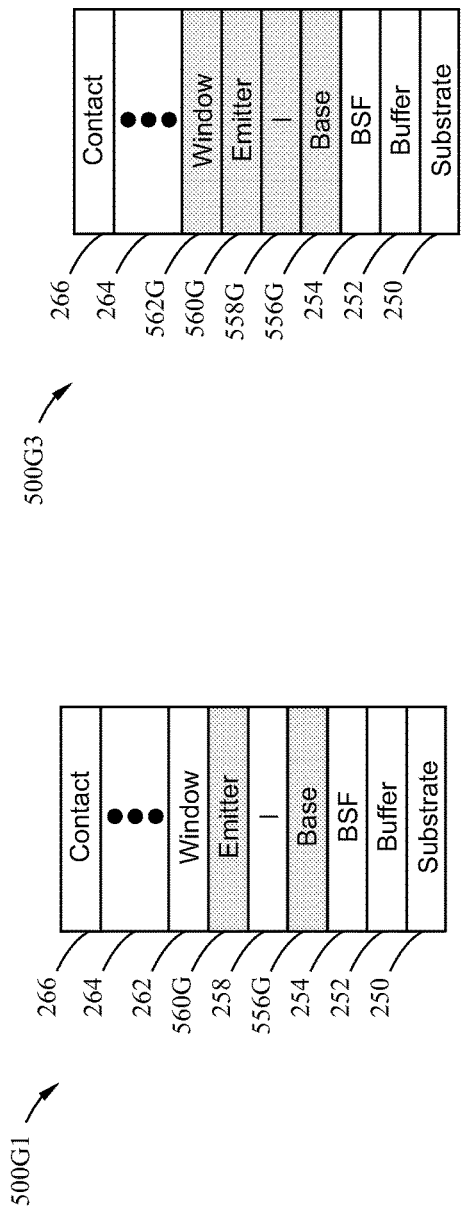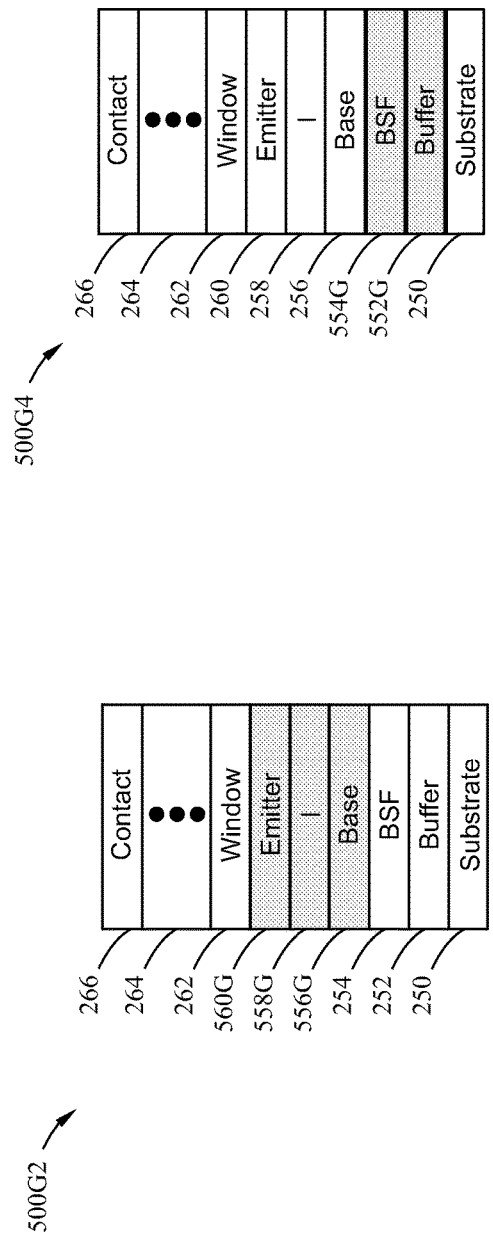

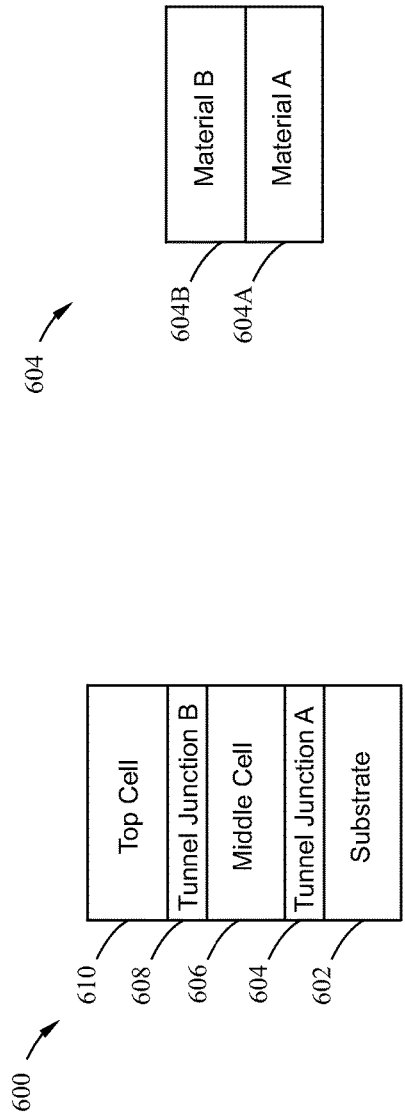
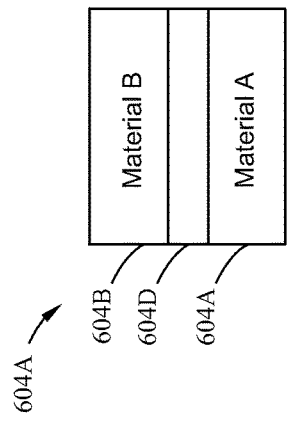
FIG. 6A
FIG. 6B
FIG. 6C

MANUFACTURING SEMICONDUCTOR-BASED MULTI-JUNCTION PHOTOVOLTAIC DEVICES

CROSS REFERENCE TO RELATED APPLICATION(S)

This application is a continuation of U.S. patent application Ser. No. 14/577,676 filed Dec. 19, 2014, entitled "Manufacturing Semiconductor-Based Multi-Junction Photovoltaic Devices," which is a continuation of U.S. patent application Ser. No. 13/924,242 filed Jun. 21, 2013, now issued as U.S. Pat. No. 8,951,827, entitled "Manufacturing Semiconductor-Based Multi-Junction Photovoltaic Devices," which claims priority to and is a non-provisional of U.S. Application No. 61/663,374 filed Jun. 22, 2012, and U.S. Application No. 61/718,708 filed Oct. 26, 2012. These applications are herein incorporated by reference for all purposes.

BACKGROUND

This disclosure relates generally to semiconductor-based photovoltaics, and more particularly, to single junction and multi-junction solar cells.

A solar cell, also referred to as a photovoltaic cell, is a semiconductor device capable of converting light energy into electrical energy through the photovoltaic effect. Solar cells employ one or more P-N junctions that produce corresponding one or more electric fields, which sweep photo-generated carriers toward the terminals of the solar cell device for collection, and developing electrical current. The cost of a solar array comprising numerous solar cells is generally proportional to the area employed by the solar cells themselves, that is the area subjected to light collection. High-efficiency solar cells are of great interest since their high energy density allows for a decrease in the area required to generate a given amount of power, thus improving the cost of electricity derived from solar energy. With a high efficiency solar cell, a higher power density requires less area, resulting in a superior system cost and moving toward fossil-fuel parity. Fossil-fuel parity may be defined as the point at which photovoltaic electricity is equal to or less costly than fossil fuel based electricity sources.

The use of multi-junction devices designed to absorb and collect different portions of the solar spectrum is an effective way to achieve a highly efficient solar cell. Solar cells formed of single-junction devices may have a maximum theoretical efficiency of approximately 31%, while solar cells formed of multi-junction devices may have a maximum theoretical efficiency of 87%. However, multi-junction devices, such as triple junction devices, are more complicated and costly to fabricate. For example, the particular materials utilized for such devices may be more difficult to synthesize, and the fabrication tolerances may be increased. Moreover, many multi-junction solar cell designs require expensive substrates, or rely on substrates that result in further fabrication difficulties and increased cost, or substrate re-use, which increases fabrication costs and decreases yield.

In some further optimized solar cell designs, semiconductor compositional grades may be employed to mitigate adverse conditions at interfaces of adjacent semiconductor layers, as part of the solar cell. For example, compositional grades may be employed to reduce surface recombination losses outside the depletion region, adjacent the window layer. This may be demonstrated with $Al_xGa_{(1-x)}As$ emitter and window layers, for example, as well as outside the depletion region in thin $CuIn_xGa_{(1-x)}Se_2$ devices. This approach may be used in a compositional grading layer between a $p$-$In_{0.5}Ga_{0.5}P$ emitter layer and $P$-$In_{0.5}Al_{0.5}P$ window layer in the $p^+$-$n$ $In_{0.5}Ga_{0.5}P$ solar cell. Certain compositional grades may also be used near a heterojunction located at the window layer within the depletion region. For example, a thin, graded $In_xGa_{1-x}N$ region may be used to minimize the valence band discontinuity between an InGaN emitter layer and the GaN window layer. Generally, these exemplary compositional grades are employed to counteract the adverse impact of semiconductor layer interfaces, as part of the solar cell device, and have generally been used in very thin, specific parts of the device stack.

What is needed is a multi-junction solar cell incorporating semiconductor materials that result in bandgaps and semiconductor compositions, which provide optimal combinations of high-efficiency and manufacturability. By enhancing the ability to manufacture solar cells with relaxed design tolerances and simplified fabrication techniques while still offering a wide range of high efficiency, the dollar-per-watt cost of solar cells may be reduced. Also needed is a solar cell design that can employ certain features, such as compositional grades, to accelerate carriers in certain key parts of the solar cell device as they are generated. The compositional grades may exist in the base and/or emitter region, the back-surface field or buffer regions, or other suitable regions disclosed herein or elsewhere, alone or in combination. The ability to use compositional grades may provide additional design flexibility in the optimal combination of high-efficiency, material thickness and relaxed design tolerances. This advantage of dollar-per-watt design flexibility may lead to achieving the best overall combination of cost and performance.

BRIEF SUMMARY

Consistent with the present disclosure, a photovoltaic device is provided that comprises a first active cell and a second active cell. The first active cell may include a base having a first semiconductor layer of silicon. The second active cell may be provided on the first active cell and include a base having a second semiconductor layer. The second semiconductor layer may include a composition of one or more semiconductor elements selected from a first group including B, Al, Ga, and In, and one or more semiconductor elements selected from a second group including As, N, P, and Sb. The composition of the second semiconductor layer may be selected to have a bandgap in a range from 1.5 eV to 1.9 eV. The photovoltaic device may further comprise a third active cell provided on the second active cell. The third active cell may include a base having a third semiconductor layer, the third semiconductor layer including a composition of one or more semiconductor elements selected from B, Al, Ga, and In, and one or more semiconductor elements selected from As, N, P, and Sb. The composition of the first semiconductor layer may have a bandgap in the range of 1.0 eV to 1.2 eV, and the composition of the third semiconductor layer may be selected to be in a range from 1.9 eV to 2.3 eV. One of the first, second and third semiconductors layers may be lattice-matched to another of the first, second, or third semiconductor layers. Alternatively, each of the first, second, and third semiconductor layers may be lattice-matched.

In certain embodiments, the first active cell may include an emitter comprising a semiconductor selected from a group of semiconductors including GaP, AlP, AlN, GaN, GaAsNP, InGaAsNP, InGaN, GaNP, GaAsN, and GaAsP. The emitter of the first active cell may further include one or more of Sb and B. The second active cell may include an emitter comprising a semiconductor selected from a group of semiconductors including GaP, AlP, AlN, GaN, GaAsNP, InGaAsNP, InGaN, GaNP, GaAsN, and GaAsP. The emitter of the second active cell may further include one or more of Sb and B.

In certain other embodiments, the compositions of the second semiconductor layer and the third semiconductor layer may be selected such that the photovoltaic device has an AM1.5G efficiency greater than 25%. The composition of each of the second and third semiconductor layers may include one or more of Al, Ga, and In, and one or more of As, N, and P. The first and second active cells of the photovoltaic device may include an emitter comprising GaP. In certain other embodiments, the photovoltaic device may further include a first tunnel junction provided between the first and second active cells and a second tunnel junction provided between the second and third active cells. The first tunnel junction may have a bandgap greater than a bandgap of the first semiconductor layer and the second tunnel junction may have a bandgap greater than a bandgap of the second semiconductor layer. Each of the first and second tunnel junctions may include GaP. The first and second tunnel junctions may also further include AlP, and the bandgap of the first tunnel junction is greater than 1.5 eV. In still other embodiments, each of the first and second tunnel junctions may include a composition of one or more of Ga, As, N, P, B, Al, Sb and In.

Consistent with another aspect of the disclosed embodiments, a photovoltaic device is provided including a substrate and an active cell provided on the substrate. The active cell may include a base layer having a thickness, the base layer having a first composition of a III-V semiconductor at a first location along the thickness of the base layer and a second composition of the III-V semiconductor at a second location along the thickness of the base layer. The base layer may have a first bandgap at the first location and a second bandgap at the second location. In some embodiments, the first bandgap may be greater than the second bandgap, or less than the second bandgap. In other embodiments, the first and second bandgaps are each within a range of bandgaps from 1.0 eV to 2.2 eV. The III-V semiconductor may be selected from a group of semiconductor elements including B, Al, Ga, In, As, N, P, and Sb. In certain embodiments, the III-V semiconductor may include less than 5% N. In still other embodiments, the bandgap of the base layer changes linearly or exponentially, or a combination thereof, from the first location to the second location. The base layer may include a third composition of the III-V semiconductor at a third location along the thickness of the base layer, such that the second location is between the first location and the third location along the thickness of the base layer. In certain embodiments, the second composition of the III-V semiconductor and one of the first or third compositions of the III-V semiconductor may be the same. In yet other embodiments, the bandgap of the base layer may change linearly along a first segment along the thickness of the base layer from the first location to the second, and along a second segment along the thickness of the base layer from the second location to the third location, the change per unit of thickness being greater in one of the first or second segments than the remaining one of the first and second segments. Alternatively, the bandgap of the base layer may change linearly from the first location to the second location, and the bandgap of the base layer may change exponentially from the second location to the third location. In still other embodiments, the bandgap of the base layer may change exponentially from the first location to the second location along the thickness of the base layer, and the bandgap of the base layer may change linearly from the second location to the third location along the thickness of the base layer.

In other embodiments, the III-V semiconductor may be a first III-V semiconductor, and the base layer may include a first composition of a second III-V semiconductor at a third location along the thickness of the base layer and a second composition of the second III-V semiconductor at a fourth location along the thickness of the base layer. The second III-V semiconductor may include elements selected from a group of semiconductor elements including B, Al, Ga, In, As, N, P, and Sb. In still other embodiments, the first active cell may include an emitter layer provided on the base layer, the emitter layer having a thickness. The emitter layer may include a first composition of a III-V semiconductor at a first location along the thickness of the emitter layer and a second composition of the III-V semiconductor at a second location along the thickness of the emitter layer.

In yet other aspects of the various embodiments, an active cell may include a base layer adjacent to a first semiconductor layer defining a first surface of the base layer, and adjacent to a second semiconductor layer defining a second surface of the base layer, the base layer including a doping gradient between the first and second surfaces of the base layer. The doping gradient may be linear or exponential, or a combination of each, between the first and second surfaces. The base layer may include a first portion and a second portion, the doping gradient may be linear within one of the first and second portions, and exponential within the other of the first and second portions.

In an example, the present disclosure provides a method of fabricating a multi-junction monolithically integrated photovoltaic device using a silicon cell and module compatible production process. The method includes providing a silicon substrate, the silicon substrate having a surface region, and providing (or forming) a first active cell on the silicon substrate, the first active cell including a base. The method includes subjecting the first active cell region to thermal process to form a buried emitter region in the first active region and cause formation of first active cell comprising a first surface region, and cleaning the first surface region to be substantially free from organic or metallic contaminants. The method includes forming a termination layer overlying the first surface region, the termination layer being a thickness of a gallium and phosphide bearing epitaxially formed material provided using a MOCVD process at a first temperature range and the thickness of the gallium and phosphide bearing epitaxial material characterized by a region having a threading dislocation density of $1 \times 10^5$ to $1 \times 10^7$ cm$^{-3}$. The method also includes forming a tunnel junction region overlying the buried emitter region and forming a back surface field region overlying the tunnel junction region. The method includes forming a second active cell using a second temperature range overlying the back surface field region, the second active cell including a base and an emitter, the second active cell formed from one or more III-V semiconductor layers and characterized by a threading dislocation density of $1 \times 10^5$ to $1 \times 10^7$ cm$^{-3}$. The first active cell region and the second active cell region are characterized by a cell level efficiency of about 25% to 37%. Further details of the present techniques can be described throughout the present specification and more particularly below.

It is to be understood that both the foregoing general description and the following detailed description are exemplary and explanatory only and are not restrictive of the invention, as claimed. Other objects, features and advantages of the invention will be apparent from the drawings, and from the detailed description that follows below.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments. In the drawings wherein like reference symbols refer to like parts:

FIG. 1B is a table illustrating the efficiencies dependent on the bandgap values of various components of the solar cell of FIG. 1A, under specific conditions in an example;

FIG. 1C is a table illustrating the tandem cell efficiency as a function of the top cell bandgap for a two-junction solar cell employing a 1.1 eV bottom cell, under specific conditions in an example;

FIG. 1D is a table listing the efficiencies as a function of the bandgap values of various cells in the multi-junction solar cell of FIG. 1A, under exemplary alternative conditions in an example;

FIG. 1E is a table listing the tandem cell efficiency as a function of the top cell bandgap for a two-junction solar cell employing a 1.1 eV bottom cell, under exemplary alternative conditions in an example;

FIG. 2A is a cross-sectional view of a portion of the solar cell of FIG. 1, consistent with various aspects of the present disclosure;

FIG. 2B is a cross-sectional view of the portion of the solar cell of FIG. 1C including a semiconductor layer incorporating a compositional grading, consistent with various aspects of the present disclosure;

FIGS. 5A-5D each depict cross-sectional views of a portion of a solar cell including compositional grading of one or more semiconductor layers, the grading may vary with respect to a geometric dimension of the corresponding semiconductor layer, consistent with various aspects of the present disclosure;

FIG. 6A is a cross-sectional view of an exemplary multi-junction solar cell, consistent with various aspects of the present disclosure;

FIG. 6B is a detailed view of an exemplary tunnel junction of the embodiment of FIG. 6A in an example;

FIG. 6C is another detailed view of an exemplary tunnel junction of the embodiment of FIG. 6A in an example;

DETAILED DESCRIPTION OF THE SPECIFIC EMBODIMENTS

Solar cells, and methods of fabrication thereof, are disclosed having architectures that promote increased efficiency. The architectures are also adapted to provide for a more uniform and consistent fabrication of the solar cell structures, leading to improved yields and lower costs. Certain solar cells may further include one or more compositional gradients of one or more semiconductor elements in one or more semiconductor layers, resulting in a more optimal solar cell device.

The following description is set forth for the purpose of explanation in order to provide an understanding of the various embodiments of the present disclosure. However, it is apparent that one skilled in the art will recognize that embodiments of the present disclosure may be incorporated into a number of different systems and devices.

The embodiments of the present disclosure may include certain aspects each of which may be present in one or more photovoltaic devices, such as solar cell devices and the like for example. Structures and devices shown below in cross-section or in block diagram are not necessarily to scale and are illustrative of exemplary embodiments meant to avoid obscuring the Specific Embodiments. Furthermore, the illustrated exemplary embodiments may include more or less structures than depicted and are not intended to be limited to the specific depicted structures. While various portions of the present disclosure are described relative to specific structures with respect to a solar cell using specific labels, such a "Emitter" or "Base", these labels are not meant to be limiting.

Reference will now be made in detail to the present exemplary embodiments, which are illustrated in the accompanying drawings.

Figure 1A:
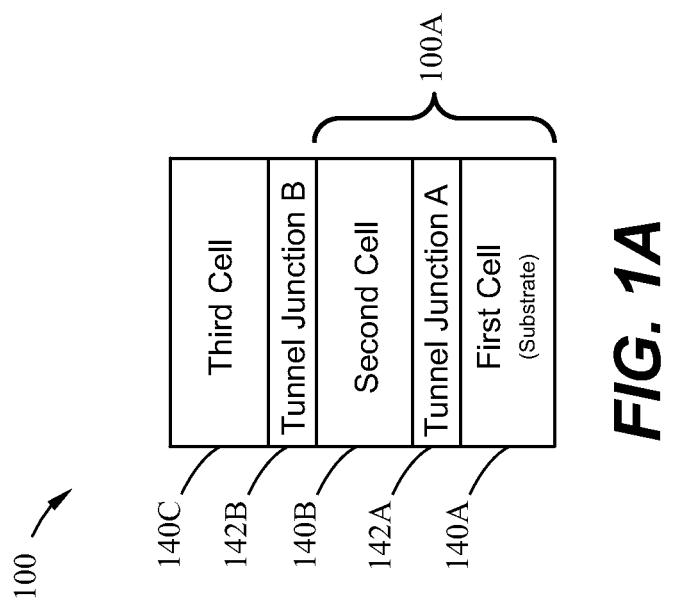
FIG. 1A is a cross-sectional view of a solar cell, consistent with various aspects of the present disclosure.

FIG. 1A illustrates an exemplary multi-junction solar cell 100, consistent with various aspects of this disclosure. The solar cell 100 is a triple junction solar cell including a first cell, or substrate, 140A, a second cell 140B, and a third cell 140C. The solar cell 100 may further include first and second tunnel junctions 142A, 142B, respectively, providing electrical conductivity therethrough while allowing a majority of the incident light to pass. A GaAs, or other suitable semiconductor material, contact layer (as discussed with respect to FIG. 1F below) may be positioned adjacent the third cell 140C to provide a low resistance path to the solar cell 100. The polarity of the solar cell 100 may be p-n or n-p, or p-i-n or n-i-p. The individual layer thicknesses of the various semiconductor layers, which comprise the solar cell, may be selected to obtain a desired current matching for maximum efficiency. Such semiconductor layers are described in greater detail in reference to FIG. 1F below. Each of the first, second, and third cells 140A, 140B, 140C may have a bandgap sequence of 1.1 eV, 1.4 to 1.9 eV, and 1.7 to 2.3 eV, respectively, and collectively provide a desired air mass 1.5 (AM1.5) efficiency, for example, an AM1.5 greater than or equal to 25%, under certain conditions. For example, to achieve the bandgap sequence described above a silicon substrate may be used as the first cell 140A, a first semiconductor composition may be used as the second cell 140B, and a second semiconductor composition may be used as the third cell 140C. The elements forming the first semiconductor composition of the second cell 140B may include one or more of a first group of semiconductor elements selected from the group of Al, Ga, and In, in combination with one or more of a second group of semiconductor elements selected from the group of As, N, P, B, and Sb. Elements forming the second semiconductor composition of the third cell 140C may include one or more of the semiconductor elements Al, Ga and In in combination with one or more of the semiconductor elements As, N, P, B and Sb.

The first semiconductor composition may be selected to provide a bandgap range of 1.4 to 1.9 eV for the second cell 140B, and the second semiconductor composition may be selected to provide for a bandgap range of 1.7 to 2.3 eV. The alloys formed as a result of the first and second group of semiconductor elements may be binary, e.g. GaP, ternary, e.g. GaAsP or GaNP, quaternary, or quinary. Furthermore, with the proper selection of the first and second semiconductor groups, the solar cell 100 may be grown lattice-matched to the silicon substrate, helping to avoid or prevent misfit dislocation formations. Properly selecting the first and second groups of semiconductor elements results in the achievement of high efficiency while improving the manufacturability of the solar cell 100.

We have observed, as the bandgap of the alloys corresponding to the semiconductor elements of each of the second and third cells 140B, 140C decreases, the second and third cells 140B, 140C may become more difficult to fabricate with sufficient optical quality suitable for photovoltaic devices, such as solar cell 100. Conversely, as the bandgap of the alloys corresponding to the semiconductor elements of the second and third cells 140B, 140C increases, the second and third cells 140B, 140C may be easier to fabricate. Consequentially, the devices disclosed or described herein offer a larger design space for AM1.5 efficiency, while tending to soften the requirement for the specific bandgap(s) in order to exceed a desired efficiency, for example, an AM1.5 efficiency equal to or greater than 25%.

Turning also to FIG. 1B, a table 100T1-1 depicts the calculated efficiencies dependent on the bandgap of various cells in a multi-junction solar cell of FIG. 1A, under certain specific conditions. In this example, 100% quantum efficiency and zero nonradiative recombination is assumed. Under these assumptions, a device model may give a fill factor (FF), voltage at open circuit (Voc), and short circuit current (Isc) for each semiconductor composition corresponding to each of the first cell 140A, second cell 140B, and third cell 140C. In this model, the layer thicknesses are automatically adjusted to provide current matching. Table Three-Junction Specific below depicts an exemplary model solution with a silicon first cell 140A, a second cell 140B having a semiconductor composition providing a bandgap of 1.48 and a third cell 140C having a semiconductor composition providing a bandgap of 1.99. The three-junction device, under such specific conditions, provides an overall or combined AM1.5G efficiency of 49.54%, as indicated in the Three-Junction Specific table.

TABLE

| Three-Junction Specific | | | | | | | | |
|---|---|---|---|---|---|---|---|---|
| 3J Specific | Eg | EQE | Isc (A) | Imp (A) | Voc (V) | Vmp (V) | Eff (%) | FF (%) |
| Top Cell | 1.99 | 100 | 14.74 | 14.41 | 1.70 | 1.69 | 23.03 | 92.11 |
| Middle Cell | 1.48 | 100 | 14.74 | 14.41 | 1.20 | 1.10 | 15.91 | 89.79 |
| Bottom Cell | 1.1 | 100 | 14.74 | 14.41 | 0.83 | 0.74 | 10.61 | 86.27 |
| Combined | N/A | 100 | 14.74 | 14.41 | 3.73 | 3.44 | 49.54 | 90.06 | where:

Eg = Bandgap;

EQE = External Quantum Efficiency;

Isc = Short Circuit Current;

Imp = Current at Max Power;

Vmp = Voltage at Max Power;

Eff = Efficiency;

FF = Fill Factor; and

Voc = Voltage at Open Circuit

The first column of table 100T1-1 of FIG. 1B indicates the possible bandgaps of the third cell 140C ranging from 1.60 to 2.30 eV, and the second through ninth columns each indicating a single bandgap value for the second cell 140B ranging from 1.20 to 1.90 eV. Thus, the table 100T1-1 of FIG. 1B depicts the calculated efficiency corresponding to the bandgap of the third cell 140C vs. the bandgap of the second cell 140B, under exemplary specific conditions. Those efficiencies greater than or equal to 25%, and where the second cell 140B has a bandgap of at least 1.40, are depicted in shaded view. Although the second cell 140B may have a bandgap of less than 1.40, such compositions may be more difficult to fabricate. Therefore, it may be desirable to only consider second cell 140B bandgap value of about 1.40 or greater. In any case, the shaded region of table 100T1-1 of FIG. 1B provides for a wide design area for three-junction devices with overall efficiencies equal to or greater than 25%, under certain specific conditions, while improving manufacturability.

Turning back to FIG. 1A, such specific designs may be applicable to two-junction solar cell devices. Such a two-junction solar cell device 100A may be similar to solar cell 100, except not including the tunnel junction B 142B and third cell 140C, thus consisting of only the first cell 140A, the second cell 140B, and the tunnel junction A 142A therebetween. With reference also to FIG. 1C, a table 100T1-2 depicts efficiency versus second cell 140B bandgap, under certain specific conditions and where the first cell 140A of a two-junction device 100A is silicon having a bandgap of 1.1 eV. As shown by the shaded portion of table 100T1-2 of FIG. 1C, the efficiency of the two-junction cell 100A is equal to or greater than approximately 25%, and with the bandgap of the second cell 140B being greater than about 1.40 eV, with the bandgap of the tandem cell or second cell 140B ranging from about 1.41 eV to about 2.21 eV.

Table Two-Junction Specific below depicts an exemplary model solution with a silicon first cell 140A, and a second cell 140B having a semiconductor composition providing a bandgap of 1.71 eV. The two-junction device 100A, under such specific conditions, provides an overall efficiency of 44.66%, as indicated in the Two-Junction Specific table.

TABLE

| 2J Specific | Eg | EQE | Isc (A) | Imp (A) | Voc (V) | Vmp (V) | Eff (%) | FF (%) |
|---|---|---|---|---|---|---|---|---|
| Top Cell | 1.71 | 100 | 21.93 | 21.40 | 1.44 | 1.34 | 28.65 | 91.06 |
| Bottom Cell | 1.1 | 100 | 21.93 | 21.40 | 0.84 | 0.75 | 16.01 | 86.48 |
| Combined | N/A | 100 | 21.93 | 21.40 | 2.28 | 2.09 | 44.66 | 89.36 | where:
Eg = Bandgap;
EQE = External Quantum Efficiency;
Isc = Short Circuit Current;
Imp = Current at Max Power;
Vmp = Voltage at Max Power;
Eff = Efficiency;
FF = Fill Factor; and
Voc = Voltage at Open Circuit Under certain circumstances, as with the two-junction or three-junction devices described herein, it may be more desirable to provide a third cell 140C semiconductor composition, in a three-junction device 100, or a second cell 140B semiconductor composition, in a two-junction device 100A, having a higher bandgap. As with the two-junction or three-junction devices described or discussed herein, potentially utilizing semiconductor compositions corresponding to wider bandgap ranges may also enhance overall manufacturability and yield.

Now turning to FIG. 1D, a table 100T2-1 depicts the calculated AM1.5G efficiency for the three-junction solar cell 100 of FIG. 1A under certain alternative conditions, with a first cell 140A having a bandgap of 1.1 eV and where a specified overall efficiency is desired, e.g. an overall AM1.5G efficiency greater than or equal to 25%. For example, 85% quantum efficiency, and a fill factor and a voltage at open circuit offset may be assumed for each of the first, second and third cells 140A, 140B, 140C. Table Three-Junction Alternative below depicts an exemplary model solution with a silicon first cell 140A, a second cell 140B having a semiconductor composition providing a bandgap of 1.50 and a third cell 140C having a semiconductor composition providing a bandgap of 2.00. The three-junction device 100, under such alternative conditions, provides an overall efficiency of 34.73%, as indicated in the Three-Junction Specific table.

TABLE

Three-Junction Alternative

| 3J Alternative | Eg | EQE | Isc (A) | Imp (A) | Voc (V) | Vmp (V) | Eff (%) | FF (%) |
|---|---|---|---|---|---|---|---|---|
| Top Cell | 2.00 | 85.00 | 12.36 | 12.25 | 1.55 | 1.33 | 16.30 | 85.78 |
| Middle Cell | 1.50 | 85.00 | 12.25 | 12.25 | 1.05 | 0.89 | 10.93 | 85.00 |
| Bottom Cell | 1.10 | 85.00 | 12.98 | 12.25 | 0.68 | 0.61 | 7.50 | 90.03 |
| Combined | N/A | 83.11 | 12.25 | 12.25 | 3.28 | 2.84 | 34.73 | 86.41 | where:
Eg = Bandgap;
EQE = External Quantum Efficiency;
Isc = Short Circuit Current;
Imp = Current at Max Power;
Vmp = Voltage at Max Power;
Eff = Efficiency;
FF = Fill Factor; and
Voc = Voltage at Open Circuit Referring to FIG. 1D, the first column of table 100T2-1 indicates the possible bandgaps of the third cell 140C ranging from 1.6 to 2.3 eV, and the second through ninth columns each indicating a single bandgap value for the second cell 140B ranging from 1.2 to 1.9 eV. Thus, the table 100T2-1 of FIG. 1D depicts the calculated AM1.5G efficiency bandgap for bandgaps of the third cell 140C vs. the bandgaps of the second cell 140B. The design includes a broad range of bandgap values contemplated herein and indicated by the outlined values highlighted within the table 100T2-1, these values providing equal to or greater than a desired 25% efficiency, while improving manufacturability through selection of certain semiconductor compositions of the second cell 140B having larger bandgap values. The outlined values are for illustration purposes only, as one of ordinary skill in the art will appreciate, for example, with a second cell 140B bandgap of 1.50 the composition of the third cell 140C may be selected to provide a bandgap in the range of 1.80 and 1.90 being outside the outlined values, the overall AM1.5G efficiency of the device being 25% or greater. The embodiments described in this disclosure are intended to embrace such bandgap ranges providing an overall AM1.5G efficiency of 25% or greater, whether or not such bandgap ranges are specifically within the outlined values highlighted within the table 100T2-1 depicted in FIG. 1D.

Turning back to FIG. 1A, the principles described herein with respect to non-specific conditions may also be applied to two-junction solar cell 100A designs, the bandgap of a Si first cell 140A being 1.1 eV and the semiconductor composition of the second cell 140B may be selected to provide a bandgap in the range from 1.56-1.96 eV. With reference also to FIG. 1E, a table 100T-2 depicts AM1.5G efficiency versus second cell 140B bandgap, where the first cell 140A of the two-junction device 100A is silicon having a bandgap of 1.1 eV. As shown, the efficiency of the two-junction cell 100A is equal to or greater than approximately 25% with the bandgap of the second cell 140B ranging from 1.56 to 1.96 eV. Under certain circumstances, as with the three-junction devices described herein, it may be more desirable to provide a second cell 140B semiconductor composition having a greater bandgap. While higher efficiencies are achievable, for example greater than 30%, material quality to achieve such efficiencies may be poor when compared to material quality corresponding to lower efficiencies, thus degrading the maximum realizable two-junction cell efficiency further than if one employed a larger bandgap. For example, a 1.91 eV top cell, which is significantly outside an specific bandgap range of 1.6 to 1.8 eV, corresponding to a peak efficiency as shown in the table 100T-2 of FIG. 1E, however a two-junction cell 100A having a 1.91 eV second cell 140B still provides an efficiency of 27%. Semiconductor compositions corresponding to bandgaps in the range of 1.56 to 1.96 provide minimal efficiency of approximately 25%, as depicted in table 100T2-2. As with the three-junction devices described or discussed herein, potentially utilizing semiconductor compositions corresponding to wider bandgaps may also enhance overall manufacturability and yield. Also, as with the three-junction cell described, the shaded regions are for illustration purposes only, as one of ordinary skill in the art will appreciate, for example, with a second cell 140B bandgap selected to be within a range of 1.56 and 1.161, although being outside the shaded region in FIG. 1E, the overall AM1.5G efficiency of the device may still be 25% or greater. The two-junction solar cell 100A described in this disclosure are intended to embrace such bandgap ranges providing an overall AM1.5G efficiency of 25% or greater, whether or not such bandgap ranges are specifically within the outlined values highlighted within the table 100T2-2 depicted in FIG. 1E.

Table Two-Junction Alternative below depicts an exemplary model solution with a silicon first cell 140A, and a second cell 140B having a semiconductor composition providing a bandgap of 1.72 eV. The two-junction device 100A, under such alternative conditions, provides an overall efficiency of 31.06%, as indicated in the Two-Junction Specific table.

TABLE

Two-Junction Alternative

| 2J Alternative | Eg | EQE | Isc (A) | Imp (A) | Voc (V) | Vmp (V) | Eff (%) | FF (%) |
|---|---|---|---|---|---|---|---|---|
| Top Cell | 1.72 | 85.00 | 18.60 | 12.25 | 1.27 | 1.08 | 20.08 | 85.00 |
| Bottom Cell | 1.10 | 85.00 | 18.99 | 12.25 | 0.68 | 0.59 | 10.98 | 87.00 |
| Combined | N/A | 84.82 | 18.60 | 12.25 | 1.95 | 1.67 | 31.06 | 85.62 | where:
Eg = Bandgap;
EQE = External Quantum Efficiency;
Isc = Short Circuit Current;
Imp = Current at Max Power;
Vmp = Voltage at Max Power;
Eff = Efficiency;
FF = Fill Factor; and
Voc = Voltage at Open Circuit While the exemplary two-junction and three-junction devices 100, 100A, under certain alternative conditions, are described as having an overall efficiency equal to or greater than 25%, this is for illustration purposes only. One of ordinary skill in the art will appreciate that other overall efficiency values may be achieved which provide a wider range of possible semiconductor composition bandgaps, which may lead to improved manufacturability and yield when compared to solutions which provide for higher overall efficiencies, but require a narrow range of composition bandgaps.

Figure 1F:
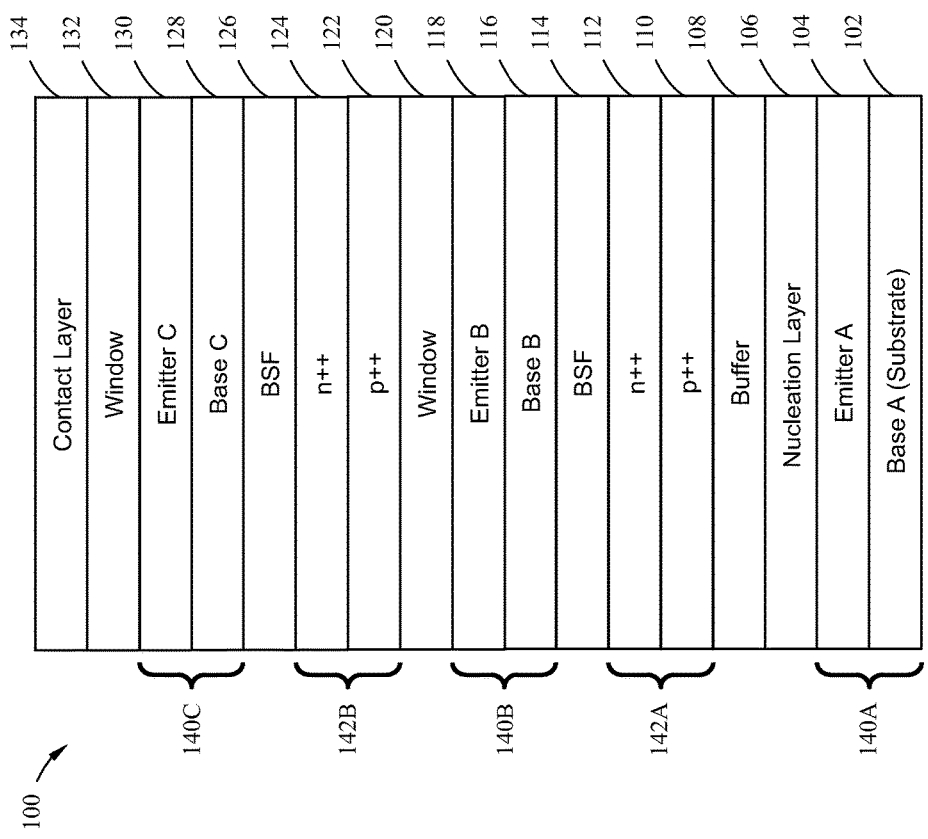
FIG. 1F is a cross-sectional view of the solar cell of FIG. 1A, in greater detail, consistent with various aspects of the present disclosure.

Now turning to FIG. 1F, a portion of the exemplary multi-junction solar cell 100 architecture in cross section is depicted in greater detail, consistent with various aspects of the present disclosure. As discussed in greater detail below, the architecture of the solar cell 100 of FIG. 1F provides for an alternate range of semiconductor bandgaps offering ease of synthesis of the particular materials used in the fabrication of the solar cell, while providing a wider range of acceptable efficiency, e.g. having an efficiency greater than 26% at an air mass of 1.5, or AM1.5. This may also result in a decrease of associated fabrication tolerances, leading to increased yields and lower fabrication costs. While the discussion below is directed to a p-on-n multi-junction solar cell, one of ordinary skill in the art will appreciate that the discussion may also apply to a n-on-p multi-junction solar cell, for example, the polarity of each semiconductor layer having an alternative doping than as described.

The multi-junction solar cell 100 of FIG. 1F may include a first cell 140A, a second cell 140B, and a third cell 140C. The first cell 140A may include a base 102, also identified as Base A, and an emitter 104, also identified as Emitter A. The second cell 140B may include a base 116, also identified as Base B, and an emitter 118, also identified as Emitter B, and the third cell 140C may include a base 128, also identified as Base C, and an emitter 130, also identified as Emitter C. The solar cell 100 may further include a first tunnel junction 142A disposed between the first cell 140A and the second cell 140B, and a second tunnel junction 142B disposed between the second cell 140B and the third cell 140C. The first base 102, or substrate 102, may include an n-type silicon substrate. To create the p-n junction in the cell 140A, a p-type heterojunction emitter 104, including silicon, may be provided adjacent to the substrate 102. Alternatively, the p-n junction may be created through a diffusion-based process. For example, phosphorous, an n-type dopant in Silicon, could be diffused into a p-type silicon base or substrate to form a heavily doped n-type region, forming a p-n junction in the silicon. In addition, a subsequent, p-type semiconductor layer could then be deposited on top of the n-type silicon region, thus forming another p-n junction. As a corollary, Boron, a p-type dopant in silicon, can be diffused into silicon to form a heavily doped p-type region. A nucleation layer 106 may be provided adjacent the Emitter A 102, followed by a buffer layer 108. The nucleation layer 106 and buffer layer 108 may include p-type or n-type GaP. The nucleation layer 106 and buffer layer 108 may also serve as a window with respect to the first cell 140A.

The non-absorbing tunnel junction 142A may then be provided adjacent the buffer layer 108, e.g. between the first cell 140A and the second cell 140B. As an example, the tunnel junction 142A may include a first layer 110 and a second layer 112. The first layer 110 of the tunnel junction 142A may include heavily doped gallium phosphide, e.g. p+GaP, while the second layer 112 of the tunnel junction 142A may include n+GaP, which is nearly lattice-matched to the silicon based cell 140A. As should be apparent to one of ordinary skill in the art, the tunnel junction 142A may include additional layers, one or more of these additional layers including heavily doped gallium phosphide, for example. A back-surface field (BSF) layer 114 may then be provided adjacent the tunnel junction 142A. The BSF layer 114 may include n-type GaP, for example.

The second cell 140B is positioned adjacent the BSF layer 114 and includes the base 116 and the emitter 118. The base layer 116 may be a lightly-doped n-type or undoped layer and the emitter layer 118 may be a highly doped p-type layer. The semiconductor of the base layer 116 may be the same as the semiconductor of the emitter layer 118. The semiconductor composition may be selected to be lattice-matched with the silicon semiconductor of the first cell 140A, and provide a bandgap between about 1.5 eV and 1.9 eV. The elements forming the semiconductor composition of the second cell 140B may include one or more of a first group of semiconductor elements selected from the group of aluminum (Al), gallium (Ga), and indium (In), in combination with a second group of one or more of semiconductor elements selected from the group of arsenic (As), nitrogen (N), phosphorous (P), boron (B), and antimony (Sb). Those skilled in the art will appreciate that being lattice-matched to silicon means that the in-plane lattice parameter of the epitaxial layer is within approximately 15% (or preferably within 0.1%) of the silicon substrate. Having the second cell 140B fabricated to lattice-match the silicon substrate 102 of the first cell 140A may reduce the possibility of generating structural defects such as misfit dislocations which degrade optoelectronic quality of subsequent semiconductor layers. Those skilled in the art will be able to determine the correct ratio of semiconductor elements in the atoms (AlGaIn) (AsNPBSb) to simultaneously meet the lattice-match condition and the bandgap range of approximately 1.5 to 1.9 eV. A window layer 120 may be positioned adjacent the second cell 140B. The window layer 120 may be comprised of AlGaP, for example.

The second non-absorbing tunnel junction 142B is positioned between the second cell 140b and the third cell 130C. The tunnel junction 142B may be similar to tunnel junction 142A, including a first layer 122, which may include p+GaP, while the second layer 124 of the tunnel junction 142B may include n+GaP, which is nearly lattice-matched to the silicon based cell 140A. As should be apparent to one of ordinary skill in the art, any suitable semiconductor material can be employed in the tunnel junction, preferably providing an optimal tradeoff for enabling good tunneling and minimal optical loss. Another BSF layer 126 may then be provided adjacent the tunnel junction 142B. As with BSF layer 114, the BSF layer 126 may include n-type GaP, for example.

The third cell 140C may include the base layer 128 and the emitter layer 130. The base layer 128 may be a lightly doped n-type or undoped layer and the emitter layer 130 may be a highly doped p-type layer, for example. The semiconductor of the base layer 128 may be the same, or different, as the semiconductor of the emitter layer 130. The semiconductor composition of the third cell 140C may be selected to be lattice-matched with the silicon semiconductor of the first cell 140A, and provide a bandgap between about 1.9 and 2.3 eV. The elements forming the semiconductor composition of the third cell 140C may include one or more of the first group of semiconductor elements selected from the group of Al, Ga, and In, in combination with the second group of one or more semiconductor elements selected from the group of As, N, P, B, and Sb. The selection of the semiconductor composition of the third cell 140C may be generally determined from the design target of the second cell 140B. Thus, with the design of the second cell 140B, a bandgap range is defined from which the third cell 140C design may be based, achieving good current matching and the desired efficiency.

The window layer 132 is provided adjacent the third cell 140C, followed by the contact layer 134. While the contact layer 134 is depicted as being as wide as the other semiconductor layers in the portion of solar cell 100 in FIG. 1F, a portion of the contact layer 134 is selectively removed to allow incident light to enter the active layers of the solar cell 100. The emitter layer 130 and the window layer 132 may be fabricated from p+GaP alone. The contact layer 134 may be fabricated from P++GaAs. While the contact layer 134 is not lattice-matched with the silicon substrate of the first cell 140A, the contact layer 134 provides a low contact resistance for interfacing to an external load.

The semiconductor layers of the solar cell 100 have been described in terms of having a first polarity, e.g. p-n. One of ordinary skill in the art will appreciate that a second polarity, e.g. p-n, may also be achieved by simply reversing the polarity of each of the semiconductor layers of the solar cell 100.

Now turning to FIG. 2A, another solar cell 200, similar to the exemplary solar cell 100 of FIG. 1A, includes a substrate 250, a buffer layer 252, and a BSF layer 254. An active cell may then be provided adjacent the BSF layer 254, the active cell including a base layer 256 and may also include an emitter layer 260. The cell also may include an intrinsic layer 258 positioned adjacent to the base layer 256 on one end of the intrinsic layer 258 and adjacent to the emitter layer 260 on another end of the intrinsic layer 258. The solar cell 200 may include additional layers 264, and a contact layer 266. In one or more of the semiconductor layers of solar cell 200, a compositional grade may be present with respect to one or more semiconductor elements, which may result in optimal collection efficiency in the solar cell 200, as well as an optimization in the open circuit voltage, Voc, and the total device thickness. Unlike doping grades present in certain solar cell devices, which may encourage electron and hole propagation in the same direction, compositional grades encourage electron and hole propagation in opposite directions, accelerating carriers as they are generated in one or more semiconductor layers throughout the device and especially within the base 256 and the emitter 260. By providing compositional grades throughout the solar cell 200, e.g. multiple portions of the solar cell 200, the overall efficiency of the solar cell 200 is increased or maximized, while reducing and minimizing device thickness and associated fabrication costs. Such a design incorporating compositional grades at one or more locations throughout the solar cell 200 can be employed in both p-n polarity configurations and n-p polarity configurations.

The solar cell 200 may be a p-n polarity solar cell design, the contact layer 266, the window layer 262 and the emitter layer 258 being p-type, and the base layer 256, BSF layer 254, buffer layer 250, and the substrate 250 being n-type. The base layer 256G may be a thicker layer since this is where a majority of the carriers may be generated. The p-n junction sweeps the electrons through the depletion region towards the n-type substrate 250 and holes through the depletion region towards the p-type contact layer 266.

Now turning to FIG. 2B, a solar cell 200G is similar to solar cell 200, but includes a base layer 256G having a compositional grade in one or more semiconductor elements, as part of the base layer 256G. The compositional grade may help to more efficiently collect the electron-hole pairs generated through the photovoltaic process, the generated electron-hole pairs collected prior to being recombined for example. For example, employing compositional grades in one or more semiconductor layers may encourage the generated electrons to travel in a first direction and generated holes to travel in a second direction opposite to the first direction. This may provide advantages with respect to conventional doping grades, which encourage generated electrons and holes to travel in the same direction. Enhanced efficiency provided by compositional grades may allow for greater design flexibility with respect to the thickness of one or more semiconductor layers, as part of a photovoltaic device. Ultimately, the thickness of one or more semiconductor layers may be reduced resulting in corresponding lower manufacturing costs. Thus, compositional grades may be employed throughout the various layers of a photovoltaic device to achieve a desired or optimal efficiency, and provide the best tradeoff of device thickness, cost, and efficiency. As should be readily apparent to one of ordinary skill in the art, changes in composition of the various semiconductor layers results in a corresponding change in bandgap of the associated composition.

The base layer 256G may include a wide array of compositional grades that may produce a bandgap in a range from 1.0 to 2.2 eV, for example. The desired bandgap range may be based on the solar cell 200G material system and desired device performance. In addition, as discussed above, the thickness of the graded base layer 200G may be reduced to minimize production costs while still providing a desired or optimal efficiency. For illustration purposes only, the BSF layer 254 may have a bandgap greater than 1.7 eV and the intrinsic layer 258 may have a bandgap of 1.6 eV. For example, the base layer 256G may be graded to have a bandgap of 1.7 eV near the interface between the BSF layer 254 and the base layer 256G, and a bandgap of 1.6 eV near the interface between the intrinsic layer 258 and the base layer 256G.

Figure 3:
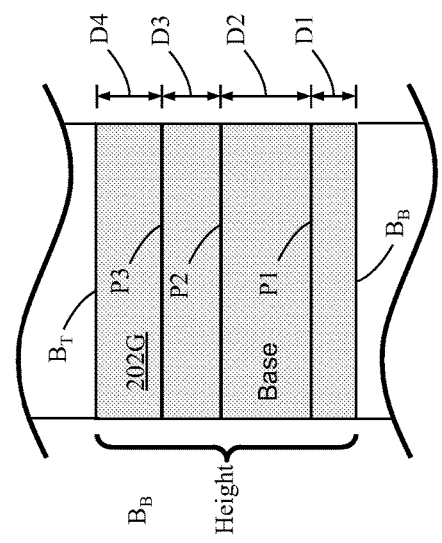
FIG. 3 is a detailed view of the portion of the solar cell of FIG. 2B, consistent with various aspects of the present disclosure.

Turning now to FIG. 3, a detailed view of the solar cell 200G is depicted. Base layer 256G may include a plurality of planes P, including planes P1-P3 for example, along a height of base layer 256G, the height extending from a bottom $B_B$ of the base layer 256G to a top $B_T$ of the base layer 256G. A first plane P1 may define a first distance D1 from the bottom $B_B$ of the base layer 256G, and a second distance D2 from the first plane P1 to a second plane P2. The second plane P2 may further define a distance D3 from the plane P2 to a plane P3, and the third plane P3 may further define a distance D4 from the third plane P3 and the top $B_T$ of the base layer 256G. The base layer 256G may include one or more compositional grades of one or more semiconductor elements along the height of the base layer 256. Thus, a first compositional grade may be defined along the distance D1, a second compositional grade may be defined along the distance D2, a third compositional grade may be defined along the distance D3, and a fourth compositional grade may be defined along the distance D4. While three planes P1, P2, and P3 are depicted, more or less planes P may exist, providing more or less distances along which compositional grades may be present, respectively. Furthermore, as should be readily apparent, the positions of the three planes P1, P2, and P3 may be defined at locations along the height of base layer 25G different from the locations depicted. Also, the linearity of the planes P are for illustration purposes only. One of ordinary skill in the art will appreciate that natural variances in the fabrication process may generally result in non-uniform layers P.

Turning to FIGS. 4A-4I, a number of exemplary curves defining the compositional grade of a semiconductor element, as part of the base layer 256G, are depicted. The compositional grade may be defined as the concentration or percentage elemental composition of a semiconductor element along the height of the corresponding semiconductor layer. As should be apparent to one of ordinary skill in the art, any given semiconductor layer of a solar cell, as described herein, may include one or more compositional grades with respect to one or more semiconductor elements. Moreover, while the following is discussed with respect to the base layer 256G, one or more such compositional grades may be provided in any of the semiconductor layers of any solar cell device. Additionally, while generally depicted as increasing in percentage of elemental composition over a dimension of a semiconductor structure, one or more compositional grades may include one or more elements which decrease in concentration over the dimension of the semiconductor structure, as well. In certain embodiments, for example, along a height of a semiconductor layer, a percentage elemental composition of a first semiconductor element may increase while a percentage elemental composition of a second semiconductor element may decrease. As with the remaining curves of FIGS. 4B-4I, the planes P1, P2 may be at the locations as depicted in FIG. 3, or they may be at any other locations along the height of the base layer 256G, including at the bottom $B_B$ or top $B_T$ of the base layer 256G. Additionally, while the descriptors P1 and P2 are used through FIGS. 4A-4I, they are not meant to be at equal locations within a given semiconductor layer per FIGS. 4A-4I.

Figure 4A:
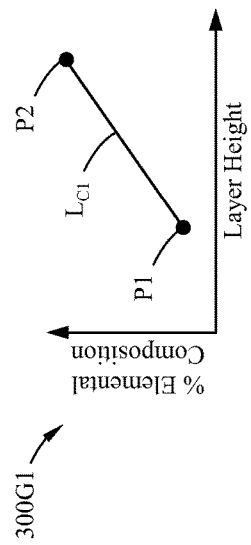
FIGS. 4A-4I each depict a curve indicating an exemplary compositional grading as a function of a dimension of a semiconductor layer, as part of a solar cell, consistent with various aspects of the present disclosure.
Figure 4B:
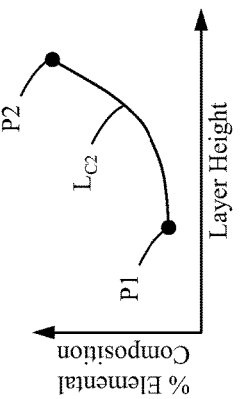
Figure 4C:
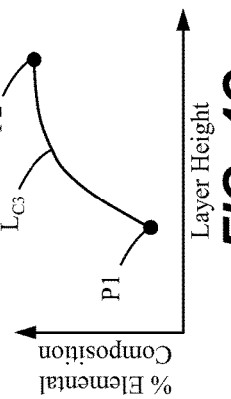

FIG. 4A depicts a graph 300G1 including the first plane P1 and the second plane P2 along the height of the base layer 256G, a line $L_{C1}$ defining a linear compositional grade of one or more semiconductor elements. Thus, the concentration of the semiconductor element, or percentage elemental composition, changes as you move across the height of the base layer 256G, from the bottom $B_B$ to the top $B_T$. In contrast to FIG. 4A, FIG. 4B depicts a graph 300G2 including the first and second planes P1, P2 along the height of the base layer 256G, a line $L_{C2}$ defining a parabolic compositional grade of a semiconductor element. Thus, the concentration of the semiconductor element, or percentage elemental composition, changes parabolically as you move across the height of the base layer 256G. FIG. 4C depicts a graph 300G3 including the first and second planes P1, P2 along the height of the base layer 256G, a line $L_{C3}$ defining an inverted parabolic compositional grade of a semiconductor element. Thus, as with line $L_{C2}$, the concentration of the semiconductor element, or percentage elemental composition, changes parabolically as you move across the height of the base layer 256G.

Figure 4D:
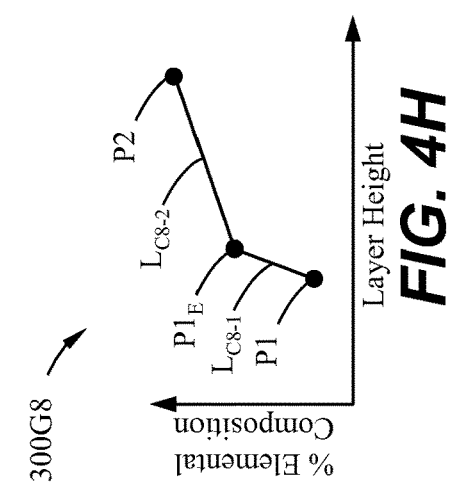
Figure 4E:
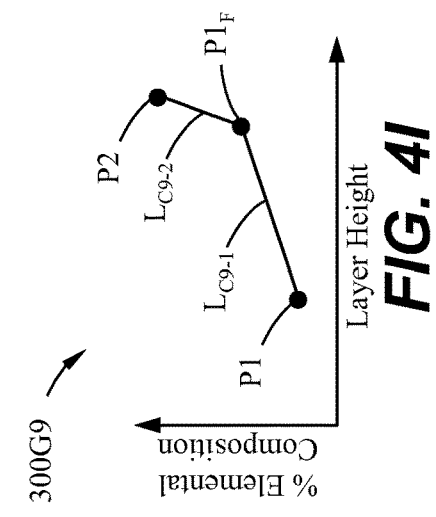

FIGS. 4D-4I include at least one additional plane $P1_A$, as part of the plurality of planes P throughout the height of the base layer 256G. FIG. 4D depicts a graph 300G4 having plane P1 and an intermediary plane $P1_A$ defining a first linear curve $L_{C4-1}$, and the intermediary plane $P1_A$ and plane P2 defining a second parabolic curve $L_{C4-2}$. Thus, over a first portion of the height of the base layer 256G the compositional grade of a semiconductor element is linear, and over a second portion of the height of the base layer 256G the compositional grade of the semiconductor element is parabolic. In contrast, FIG. 4E depicts a graph 300G5 including at least one additional plane $P1_B$, as part of the plurality of planes P along the height of the base layer 256G, plane P1 and the intermediary plane $P1_B$ defining a first linear curve $L_{C5-1}$, and the intermediary plane $P1_A$ and plane P2 defining a second parabolic curve $L_{C5-2}$. Thus, over a first portion of the height of the base layer 256G, defined by curve $L_{C5-1}$, the compositional grade of a semiconductor element is parabolic, and over a second portion of the height of the base layer 256G, defined by curve $L_{C5-2}$, the compositional grade of the semiconductor element is linear.

Figure 4F:
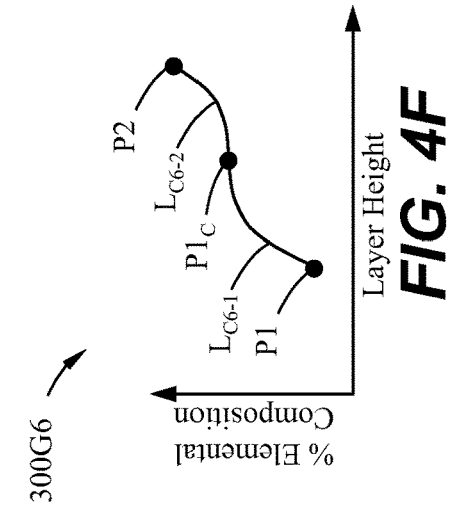
Figure 4G:
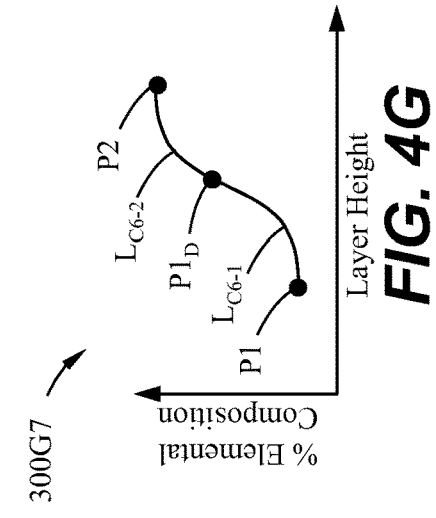

Turning to FIG. 4F, a graph 300G6 is illustrated including at least on additional plane $P1_C$, plane P1 and the intermediary plane $P1_C$ defining an inverted parabolic curve $L_{C6-1}$, and the intermediary plane $P1_C$ and plane P2 defining a parabolic curve $L_{C6-2}$. Thus, over a first portion of the height of the base layer 256G, defined by curve $L_{C6-1}$, the compositional grade of a semiconductor element is inversely-parabolic, and over a second portion of the height of the base layer 256G, defined by curve $L_{C6-2}$, the compositional grade of the semiconductor element is parabolic. In contrast, FIG. 4G depicts a graph 300G7 including at least on additional plane $P1_D$, such that plane P1 and the intermediary plane $P1_D$ defines a parabolic curve $L_{C7-1}$, and the intermediary plane $P1_D$ and plane P2 defining an inverted parabolic curve $L_{C7-2}$. Thus, over a first portion of the height of the base layer 256G, defined by curve $L_{C7-1}$, the compositional grade of a semiconductor element is parabolic, and over a second portion of the height of the base layer 256G, defined by curve $L_{C5-2}$, the compositional grade of the semiconductor element is inversely-parabolic.

Figure 4H:
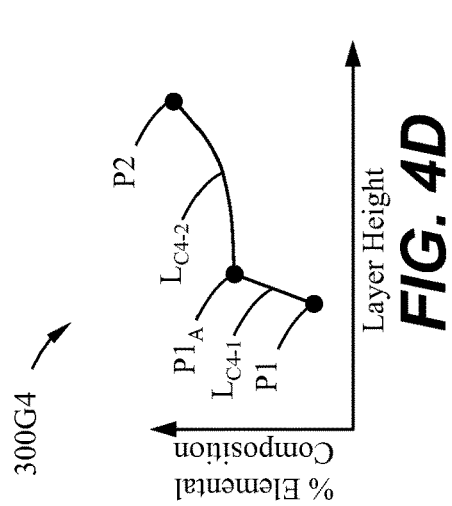
Figure 4I:
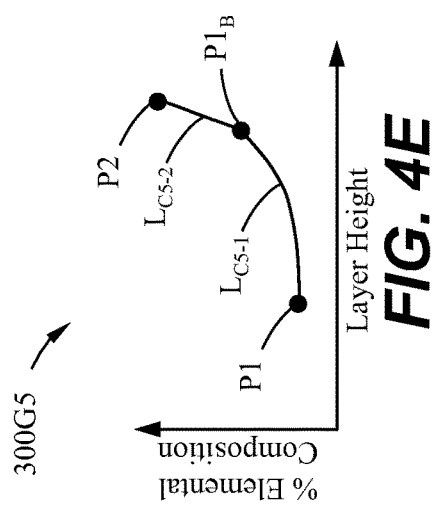

Now turning to FIG. 4H, a graph 300G8 is illustrated including at least one additional plane $P1_E$, plane P1 and the intermediary plane $P1_E$ defining a first linear curve $L_{C8-1}$, and the intermediary plane $P1_E$ and plane P2 defining a second linear curve $L_{C8-2}$, the slope of the first curve $L_{C8-1}$ being greater than the slope of the second linear curve $L_{C8-2}$. Thus, over a first portion of the height of the base layer 256G, defined by curve $L_{C8-1}$, the compositional grade of a semiconductor element is linear and changing in concentration, or percentage elemental composition, at a faster rate over the height of the base layer 256G as compared to the compositional grade of the semiconductor element defined by curve $L_{C8-2}$. In contrast, FIG. 4I depicts a graph 300G9 including at least one additional plane $P1_F$, such that plane P1 and the intermediary plane $P1_F$ defines a first linear curve $L_{C9-1}$, and the intermediary plane $P1_F$ and plane P2 defining a second linear curve $L_{C9-2}$, the slope of the first curve $L_{C9-1}$ being less than the slope of the second curve $L_{C9-2}$. Thus, over a first portion of the height of the base layer 256G, defined by curve $L_{C9-1}$, the compositional grade of a semiconductor element is linear and changing in concentration, or percentage elemental composition, at a slower rate over the height of the base layer 256G as compared to the compositional grade of the semiconductor element defined by curve $L_{C9-2}$.

As should be apparent, FIGS. 4A-4I depict only a few exemplary curves illustrative of compositional grades of one or more semiconductor elements, as part of solar cell structures, such as solar cell 200 of FIG. 2.

Turning to FIGS. 5A-5D, exemplary solar cells 500, shown as solar cell 500G1 through solar cell 500G4, are depicted where one or more of the semiconductor layers include compositional grades of one or more semiconductor elements in one or more corresponding semiconductor layers, for example according to one or more curves of FIGS. 4A-4I, or a combination of such curves. Generally, the solar cells 500 may be a P-on-N or P-i-N solar cell design or a N-on-P or N-i-P solar cell design. Given a P-on-N solar cell design, the solar cell 500 may include a substrate 250, followed by a buffer layer 252, a BSF layer 254, and a base layer 256, each being N doped. The solar cell may also include an emitter layer 260, a window layer 262, and a contact layer 266, each being P doped, and an intrinsic region provided between the P-doped emitter layer 20 and the N-doped base layer 256. A contact layer 266 may be provided adjacent to a portion of the window layer 262 to provide electrical interfaces to an electrical load. The solar cells 500 may include a thicker base layer 256, where a majority of the carriers are generated, the P-N junction sweeping electrons through the depletion region towards the N-type substrate and holes through the depletion region towards the P-type contact layer 266. Accordingly, the compositional grades of one or more elements in one or more semiconductor layers of the solar cells 500 may be adapted to accelerate carriers upon their creation, thus minimizing the chance of recombining prior to collection.

While the solar cells 500 have been described as single cell devices, solar cells 500 may be part of a multi-cell device incorporating two or more solar cells 500, as represented by additional layers or sub-cells 264. In such multi-cell devices each of the two or more solar cells 500 may be the same or different than the remaining solar cells 500, as desired. The various semiconductor layers of solar cell 500 are shown for illustration purposes and are not to scale. One of ordinary skill in the art will appreciate that solar cell 500 may include more or less semiconductor layers than depicted in FIGS. 5A-5E. The solar cell 500 may be designed to provide a wide array of compositional grades to achieve a desired bandgap, for example between 1 eV and 2.2 eV, depending upon a specific design for a given solar cell material system and associated solar cell performance.

Turning specifically to FIG. 5A, a solar cell 500G1 is depicted, similar to solar cell 200, except the solar cell 500G1 includes a base layer 556G and an emitter layer 558G, each including compositional grades of one or more semiconductor elements. While the solar cell 500G1 is depicted as having a base layer 556G including a compositional grade, the solar cell 500G1 may have only one layer including a compositional grade, for example only the emitter layer 558G. The solar cell 500G1 may be designed such that the one or more compositional grades provide a bandgap in the range from about 1.0 eV to about 2.2 eV. With the intrinsic layer 258 having a bandgap of about 1.7 eV and the window layer 262 having a bandgap greater than 1.7 eV, the compositional grade of the emitter layer 558G may be selected such that a bandgap of approximately 1.7 eV is provided near a plane where the emitter layer 558G interfaces with the intrinsic layer 258, and a bandgap at or near the bandgap of the window layer 262 near a plane where the emitter layer 558G interfaces with the window layer 262. For example, with a window layer having a bandgap of 1.9 eV, the bandgap of the compositional grade of the emitter layer 558G near the plane where the emitter layer 558G interfaces with the window layer 262 would be at or near 1.9 eV. In some situations, it may be desirable to provide a slight step-function, also referred to as a step-grade, in the compositional grade at the interface between the emitter layer 560G and the window layer 262.

A solar cell 500G2 depicted in FIG. 5B is similar to the solar cell 500G1, however includes an intrinsic layer 558G including a compositional grade. For illustration purposes only, the base layer 556G may include a compositional grade such that the bandgap at the interface between the base layer 556G and the BSF layer 254 may be at or near 1.6 eV and the bandgap at the interface between the base layer 556G and the intrinsic layer 558G may be at or near 1.7 eV. The bandgap at the interface between the intrinsic layer 558G and the emitter layer 560G may be at or near 1.75 eV and the bandgap at the interface between the emitter layer 560G and the window layer 562G may be at or near 1.9 eV. Turning to FIG. 5C, solar cell 500G3 may be similar to the solar cell 500G2, but also including a window layer 562G having a compositional grade such that, continuing from the prior example immediately above, the bandgap at the interface between the emitter layer 560G and the window layer may be 1.9 eV and the bandgap at the interface between the window layer 52G and the contact layer 266 may be at or near 1.9 eV. The compositional grades of the various semiconductor layers of solar cells 500G1-500G3 may cooperate to provide desired bandgaps throughout the solar cell 500, while accelerating carriers upon their creation, and minimizing the chance of recombining prior to collection.

Turning to FIG. 5D, a solar cell 500G4 is depicted, generally similar to other solar cells 500 but including a BSF layer 554G which includes a compositional grade. Since the BSF layer 554G may include a wider bandgap than the base layer 256, the bandgap values throughout the compositional grading of the BSF layer 554G must be greater than the bandgap of base layer 256, as well as the upper layers of the cell 500G4, e.g. the intrinsic layer 258 and the emitter layer 260. For a buffer layer 252 having a bandgap greater than 1.7 eV, and a base layer 256, intrinsic layer 258, and emitter layer 260 each having a bandgap of 1.7 eV, the BSF layer may employ a graded region having a bandgap ranging from 1.86 eV near the interface between the BSF layer 554G and the buffer layer 552 to 1.9 eV near the interface between the BSF layer 554G and the base layer 256. As discussed, solar cell 500G4 may only include a single compositional grading layer, e.g. the BSF layer 554G. Alternatively, solar cell 500G4 may include additional layers having compositional grades, such as a buffer layer 552G, as depicted in FIG. 5D. With the buffer layer 552G employing a compositional grade, the bandgap of the buffer layer 552G may be wider than the base layer 256. Accordingly, all grades may start at an initial composition that provides a bandgap greater than the base layer 256, the intrinsic layer 258, and the emitter layer 260. For illustration purposes only, the buffer layer may include a compositional grading such that a bandgap of 1.8 eV appears at the interface between the substrate 250 and the buffer layer 552G, and a bandgap of 1.86 eV appears at the interface between the BSF layer 554G and the buffer layer 552G. Furthermore, the BSF layer 554G may include a compositional grading such that a bandgap of 1.9 eV appears at the interface between the BSF layer and the base layer 256.

The compositional grades discussed herein may be fabricated with a variety of materials on a variety of substrates, and are not limited to the materials and/or the substrates discussed herein. Additionally, both strained and lattice matched materials may be employed. Furthermore, while certain compositional grade concentrations, or percentage elemental compositions, are provided, these are for illustration purposes only. For illustration purposes, a multi-junction semiconductor device may be fabricated as a tandem solar cell and include structure in the form of Si/GaAsNP. Beginning with an n-type silicon substrate, an initial treatment may be performed to create the p/n junction in the silicon solar cell. This could either be a diffusion-based process, deposited Si emitter, or a p-type heterojunction emitter. Next, a non-absorbing tunnel junction may be deposited on the first cell. The tunnel junction may be p+GaP, which is nearly lattice-matched to silicon. The tunnel junction could also employ a graded layer. Above the tunnel junction, a BSF layer may be deposited along with subsequent layers of additional cell structures to form multi-cell devices.

Figure 5E:
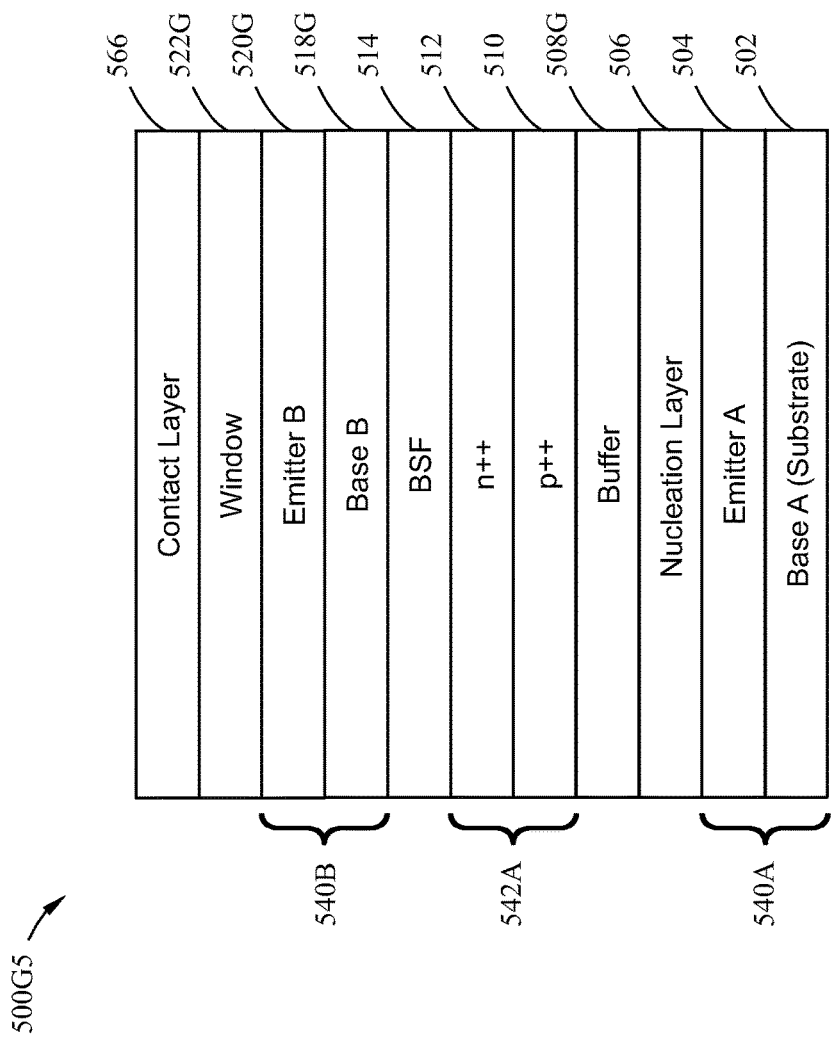
FIG. 5E depicts a cross-sectional view of a portion of an exemplary solar cell include compositional grading of one or more semiconductor layers, consistent with various aspects of the present disclosure.

Now turning to FIG. 5E, an exemplary multi-junction solar cell 500G5 is shown, in cross section. Solar cell 500G5 includes one or more semiconductor layers having compositional grades. The compositional grades can be in terms of one or more semiconductor elements, as part of the associated semiconductor layer. While the solar cell 500G5 is discussed as having a p-on-n structure, one of ordinary skill in the art will appreciate that the solar cell 500G5 can also be in the form of a n-on-p structure.

Solar cell 500G5 may include a first sub-cell or cell 540A and a second sub-cell or cell 540B, and a non-absorbing tunnel junction 542A positioned between the first cell 540A and the second cell 540B. The first cell 540A may include a substrate or base layer 502 and an emitter layer 504. The base layer 502 may be n-doped silicon, n-Si, while the emitter 504 may be heavily p-doped silicon, p+Si. A nucleation layer 506 may be utilized on the emitter layer 504 of the cell 540A. A buffer layer 508G may then be deposited upon the nucleation layer 506, and may include a compositional grading involving one or more semiconductor elements. For example, the buffer layer 508G may be fabricated from p-doped $Al_{(1-Z)}Ga_ZAs_{(1-X-Y)}N_{(Y)}P_{(X)}$, where X, Y and Z represent compositional grade variables to achieve a desired corresponding bandgap gradient over the thickness of the buffer layer 508G. For illustration purposes only, compositional grade variable x may be in the range from 0.85 to 0.92, and the compositional grade variable y may be in the range from 0.015 to 0.025 to provide a bandgap gradient over the thickness of the buffer layer 508G in the range from 1.8 eV to 1.9 eV.

The tunnel junction 542A may then be positioned upon the buffer layer 508G. The tunnel junction 542A may include a first semiconductor layer 510 heavily p-doped and a second semiconductor layer 512 heavily n-doped. A BSF layer 514 may be provided on the tunnel junction 542A, the BSF layer 514G including a compositional grade of one or more semiconductor elements. For example, the BSF layer 514G may include n-doped $Al_{(1-Z2)}Ga_{Z2}As_{(1-X2-Y2)}N_{(Y2)}P_{(X2)}$, where X2, Y2 and Z2 represent compositional grade variables to achieve a desired corresponding bandgap gradient over the thickness of the BSF layer 514G. For illustration purposes only, compositional grade variable x2 may be in the range from 0.8825 to 0.9975, and the compositional grade variable y2 may be in the range from 0.0025 to 0.0175 to provide a bandgap gradient over the thickness of the BSF layer 514G in the range from 1.9 eV to 2.2 eV. The base layer 518G of the second cell 540B may be provided on the BSF layer 514G, and may include a compositional grade of one or more semiconductor elements. For example, the base layer 518G may be n-doped $GaAsN_{(Y3)}P_{(X3)}$, where X3 and Y3 represent compositional grade variable to achieve a desired corresponding bandgap gradient over the thickness of the base layer 518G. For illustration purposes only compositional grade variable x3 may be in the range from 0.81 to 0.88, and the compositional grade variable y3 may be in the range from 0.03 to 0.02 to provide a bandgap gradient over the thickness of the base layer 518G in the range from 1.70 eV to 1.80 eV. An emitter layer 520G may be provided on base layer 518G to form the second cell 540B, and the emitter layer 520G may include a composition include grades of one or more semiconductor elements. For example, the emitter layer 520G may be p-doped $Al_{(X4)}Ga_{(1-X4)}P$, where X4 represents a compositional grade variable to achieve a desired corresponding bandgap gradient over the thickness of the emitter layer 520G. For illustration purposes only, compositional grade variable X4 may be in the range from 0 to 0.2 to provide a bandgap gradient over the thickness of the emitter layer 520G in the range from 2.2 eV to 2.3 eV.

A window layer 532G may be provided on the second cell 540B, the window layer 532G may include a composition including grades of one or more semiconductor elements. For example, the window layer 532G may be p-doped $Al_{(X5)}Ga_{(1-X5)}P$, where X5 represents a compositional grade variable to achieve a desired corresponding bandgap gradient over the thickness of the window layer 522G. For illustration purposes only, compositional grade variable x5 may be in the range from 0.20 to 0.65 to provide a bandgap gradient over the thickness of the window layer 522G in the range from 2.3 eV to 2.4 eV. To provide an electrical interface between the solar cell 500G5 and a load (not shown), a contact layer 566, including heavily p-doped GaAs for example, may be provided on window layer 522G. While solar cell 500G5 is depicted as a p-on-n structure, where the substrate is n-doped for example, solar cell 500G5 may be fabricated as a n-on-p structure, the polarity of each semiconductor layer having an alternative doping than as described above.

For an optimized solar cell, optimized using compositional grades for example, it may be desirable to also optimize the tunnel junctions employed between sub-cells or cells in a multi-junction solar cell device. For example, to reduce the potential barrier for the generated carriers to travel between different cells, these cell structures are interfaced through the use of tunnel junctions. To minimize optical absorption in the semiconductor layers forming one or more tunnel junctions, the bandgap of these layers should be greater than the bandgap of the substrate, greater than 1.1 eV for a substrate of silicon for example. High bandgap tunnel junctions for multi-junction solar cell devices employing materials having bandgaps greater than 1.8 eV may be fabricated using (AlInGa)(PAsN). The lattice parameter of such tunnel junction material will also be closely matched to that of Si.

Turning to FIG. 6A, an exemplary multi-junction solar cell 600 includes a substrate or first cell 602, a middle cell 606 and a tunnel junction 604 provided therebetween. Solar cell 600 may further include a top cell 610 and a tunnel junction 608 provided between the middle cell 606 and the top cell 610. For illustration purposes only, the substrate 602 may be Si and, thus, have a bandgap of 1.1 eV. The multi-junction solar cell 600 may be optimized, through fabrication techniques for example, to provide middle cell 606 with a bandgap in the range of 1.5 eV to 1.9 eV, and top cell 610 with a bandgap in the range of 1.9 eV to 2.3 eV. Tunnel junctions 604, 608 may then be designed employing multiple materials based on the (AlInGa)(PAsN) material system, the materials closely lattice matched to a Si substrate. As one of ordinary skill in the art will appreciate, applying the teachings of this disclosure to two-junction solar cell devices would potentially result in different bandgap ranges, the second cell having a bandgap range of 1.5 eV to 1.9 eV for example.

Turning to FIG. 6B, an exemplary tunnel junction 604 may include a first layer 604A fabricated from a first material, Material A, and a second layer 604B fabricated from a second material, Material B. Tunnel junction 608 may includes similar structures and materials as tunnel junction 604. For illustration purposes only, the first layer 604A may include carbon (C) doped GaP and the second layer 604B may include tellurium (Te) doped AlP, the resulting tunnel junction 604 having a bandgap greater than 2.2 eV. Alternatively, the first layer 604A may include carbon doped AlGaP, represented by the compositional equation $Al_xGa_{(1-x)}P$, and the second layer 604B may include tellurium doped $Al_xGa_{(1-x)}P$, where the composition of each of the layers 604A, 604B may be adjusted as desired, to minimize oxidation which may lead to degraded performance for example. In such systems Ga may be increased, resulting in a more stable composition, but perhaps with a lower bandgap. As another example, the first layer 604A may include carbon doped AlGa(In)AsNP, and the second layer 604B may include tellurium doped AlGa(In)AsNP, the resulting tunnel junction 604 having a bandgap greater than 1.8 eV. Any combination of the above materials, e.g. binary, ternary, or quaternary, may be employed for the fabricated of the tunnel junctions 604, 608. While carbon and tellurium are described as the corresponding p-type and n-type dopants, respectively, any suitable dopants may be employed, for example, p-type dopants may also include zinc and magnesium, and n-type dopants may also include silicon and selenium, to name a few.

Turning to FIG. 6C, the tunnel junction 604-1 is similar to tunnel junction 604, but includes a delta-doped layer 604D between the first layer 604A and the second layer 604B. The various layers 604A, 604B, 604D of tunnel junction 604-1 are not to scale relative to each other, and need not have relative thicknesses as shown. For example, the first layer 604A may have a thickness in the range from 2 nm to 20 nm, the second layer 604B may have a thickness in the range from 2 nm to 20 nm, and the delta-doped layer 604D may be considered to have a negligible thickness. However, those skilled in the art can achieve the effect of delta-doping by heavily doping a layer with a thickness in the range from 1 nm to 10 nm. The delta-doped layer 604D may be included to improve the current handling capability of the tunnel junction 604A, providing for a more optimized solar cell 600 for example.

The presence of the delta-doped layer 604D may increase the current carrying capability of the tunnel junctions 604A in the Ga(In)AsNP layers having bandgaps greater than 2 eV, where high levels of doping may be more difficult to achieve. More specifically, with the first layer 604A including carbon doped Ga(In)AsNP and the second layer 604B including tellurium doped Ga(In)AsNP, where the corresponding bandgaps of the first and second layers 604A, 604B are greater than 2 eV, a delta-doped layer 604D of tellurium may be provided to increase the current carrying capability of the tunnel junction 604A. The delta doping layer 604D may be achieved through any suitable means, for example through traditional delta doping techniques or bulk layer delta doping techniques. For example, in traditional delta doping, the crystal growth of the current semiconductor, e.g. of the first layer 604A, may be paused and the doping material may then be grown, or otherwise deposited, followed by the continued crystal growth, e.g. of the second layer 604B. Alternatively, you could continue to grow the crystal and then add doping material to exceed the saturation growth of the current material.

Figure 8:
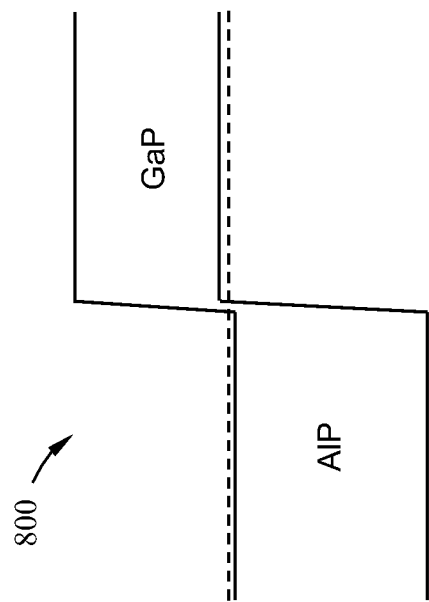
FIG. 8 depicts an exemplary tunnel junction, consistent with various aspects of the present disclosure.
Figure 7:
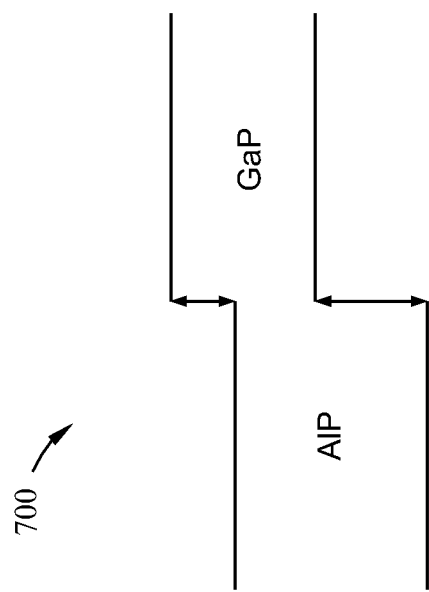
FIG. 7 is a curve which depicts the band gap alignment, consistent with various aspects of the present disclosure.

Turning to FIG. 7, the band alignment of an exemplary AlP/GaP heterointerface is depicted. AlP/GaP includes a type-II band alignment. A tunnel junction is formed from AlP:Te/GaP:C doped layers, as depicted in FIG. 8. The doping levels in AlP and GaP may be greater than $5 \times 10^{18}$ $cm^3$. Tunnel junctions using Ga(In)AsNP layers can be formed with or without a delta-doped interconnecting layer in between the p++ and n++ layers of the tunnel junction. The delta-doped layer will increase the current carrying capability of the tunnel junction in the Ga(In)AsNP layers with bandgaps greater than 2 eV, where high levels of doping are difficult to achieve.

In an example, the present method includes a termination layer comprising either aluminum or indium, or the like. In an example, aluminum in an MOCVD/MOVPE environment reduces Ga/Si-related shunts, and other imperfections. In an example, gallium interacts with silicon and can 'etch-back" or "attack" silicon. A crystal defect can form where gallium etches back the silicon. We have also observed that the presence of excessive gallium can cause these Ga/Si defects to occur readily. In addition, during top cell deposition, these defects can propagate upward through the crystal all the way to the wafer surface. The gallium related defect "spikes" can cause a shunt when the defect is located under a bus bar. Thus, during deposition of the termination layer and subsequent top cell, gallium present in the chamber or residing on internal chamber parts from prior deposition runs can attack the silicon and develop Ga/Si related spikes. These can act as a shunt on a solar cell device and cause a short circuit. These and other limitations have been overcome using the present techniques.

That is, in an example, the present techniques have overcome these limitations. One approach is to use "clean" chamber internal parts for each deposition. However, this is not as conducive to developing a high-throughput, low-cost process. Alternatively, we have found that using aluminum in an MOCVD environment drastically reduces the interaction of Ga and Si. This reduces the presence of Ga/Si related defects and allows us to us deposition chamber maintenance procedures more conducive to high-throughput, low-cost manufacturing. In addition, aluminum is generally less costly and more readily available than gallium, so aluminum is preferred for a more favorable cost structure.

Figure 9:
FIG. 9 illustrates an example of wafer with an AlP termination layer and no evident Ga related defects.
Figure 10:
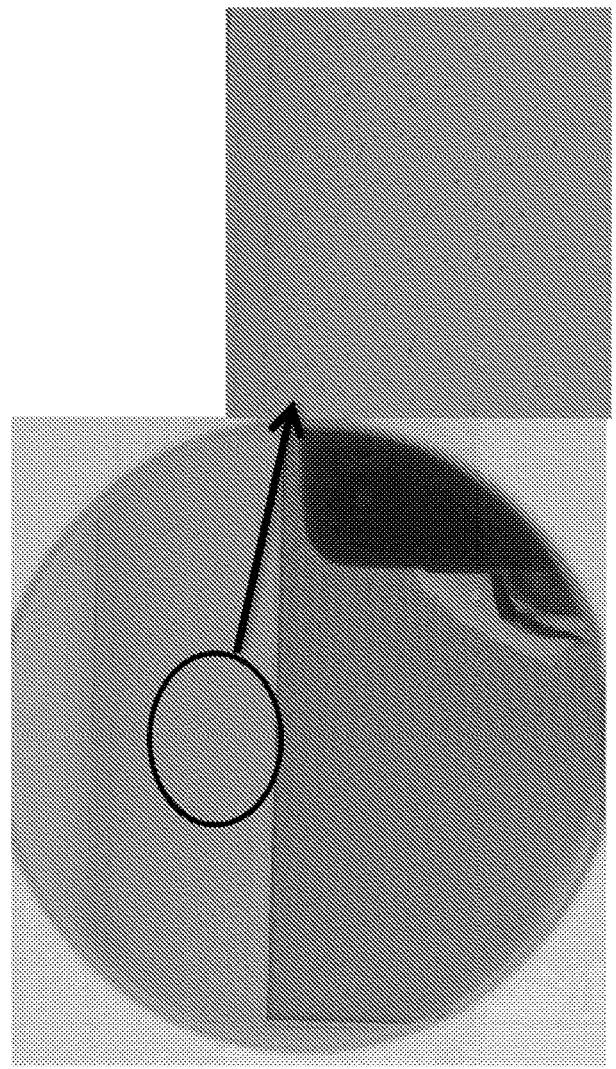
FIG. 10 is an example of a wafer with a GaP termination layer and Ga-etch back related defects. The image on the right hand side is a magnified image of the highlighted portion on the left image that shows the dark spots, which are Ga etch back related defects/spikes.

In an example, as shown in FIG. 9, the present technique illustrates an example of wafer with an AlP termination layer and no evident Ga related defects. As shown in FIG. 10 is an example of a wafer with a GaP termination layer and Ga-etch back related defects. The image on the right hand side is a magnified image of the highlighted portion on the left image that shows the dark spots, which are Ga etch back related defects/spikes.

Figure 11:
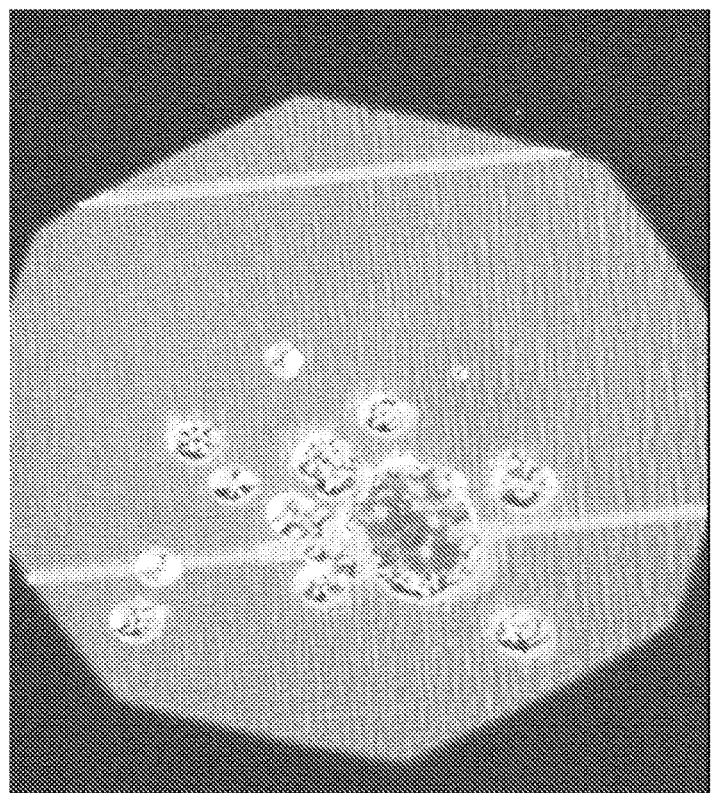
FIG. 11 illustrates a shunted area in a solar cell caused by Ga "spikes" that interact with silicon and propagate upwards during top cell deposition in an example. This shunt is directly under a device finger, thus shorting the solar cell.
Figure 12:
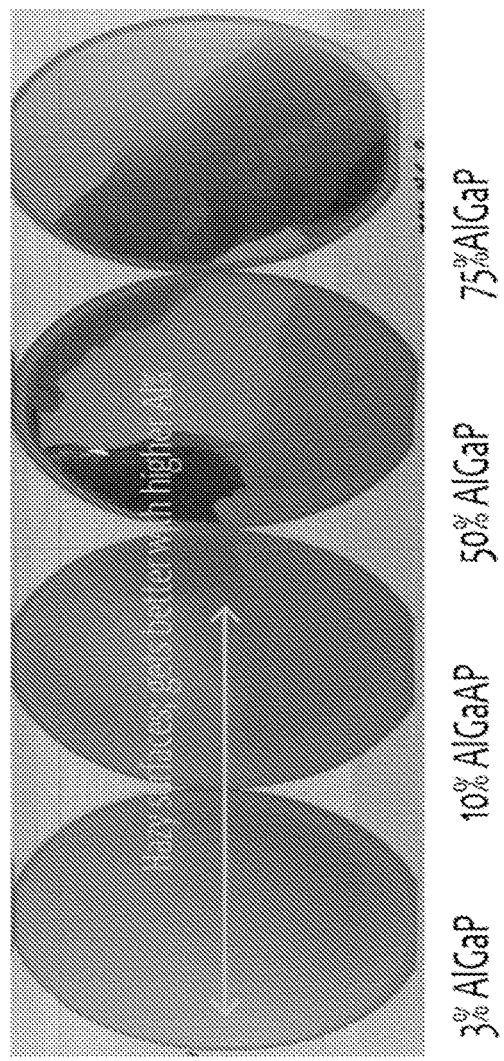
FIG. 12 illustrates some photographs showing surface morphology improving as the Al % increases in the AlGaP termination layer in an example. These wafers all employed a 100 A termination layer with 3.5 um of GaP deposited on top. Surface morphology is optimal when the Al % in the termination layer exceeds 50%.
Figure 13:
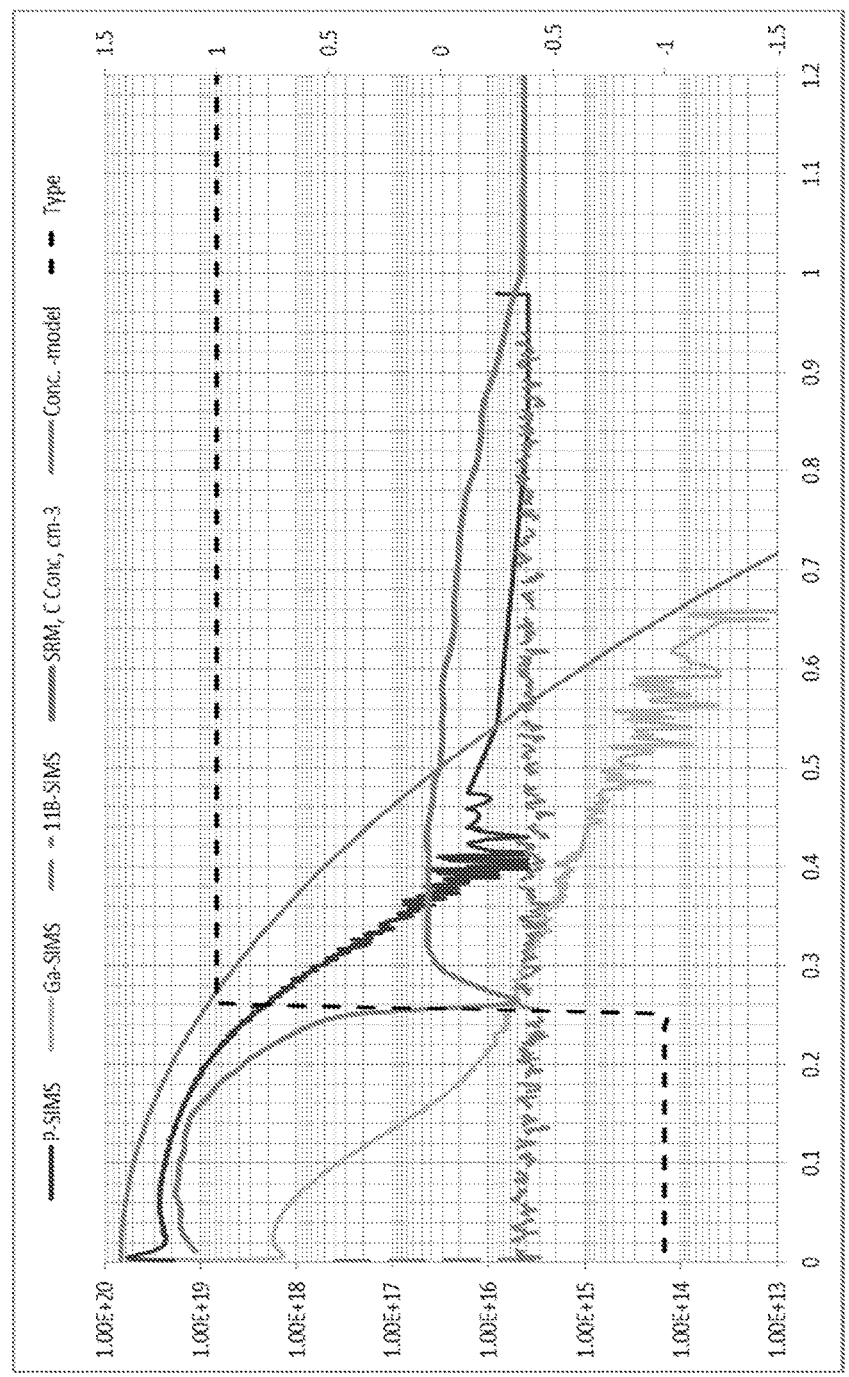
FIG. 13 shows the diffusion profile of P (red curve) in a Si substrate in an example. The diffusion was performed in an MOCVD reactor at 100 mbar. The diffusion was performed at 1100 C for 5 min in PH3 and H2 and the drive-in at 1150 C for 1.5 min in H2. The blue curve shows the active n-type doping concentration. This total diffusion and drive-in was performed in less than 10 minutes, which still enables a high-throughput process.

In an example shown in FIG. 11 illustrates shunted areas in a solar cell caused by Ga "spikes" that interact with silicon and propagate upwards during top cell deposition. This shunt is directly under a device finger, thus shorting the solar cell. We have found that concentrations ranging from Al(50%)Ga(50%)P to Al(100%)P reduce this Ga-related effect and also provide good surface morphology. In an example shown in FIG. 12 are some photographs showing good quality surfaces ranging with Al %>50%. Because AlP readily oxidizes, it is recommended to employ concentrations of Al ranging from 50% to 90% to ensure a stable termination layer. As shown, FIG. 13 illustrates a 100 A termination layer with 3.5 μm of GaP deposited on top. Surface morphology improves with Al % in the AlGaP nucleation. In an alternative example, the present technique introduces 0.5%-3% nitrogen to lattice match to silicon to form AlGaNP.

In a further example, indium can be introduced to interact with gallium, which is similar to aluminum. Aluminum is not an element that can typically be employed in a HVPE/VPE environment, so indium should be able to be used instead of aluminum in a VPE environment with the same effect.

In an example, the present technique includes an epitaxially formed material deposited with VPE,HVPE, LPE or MBE. In an example, it is preferable to use VPE/HVPE with all hydrides for our group V elements (NH3, PH3, AsH3). VPE and HVPE can achieve high growth rates in an example. In an example, deposition rates exceed 30 um/hour and a tool platform that can produce >150,000 wafers per year. In an example, capital equipment cost target for 1-sun applications is to have less than $3 of capital equipment cost per annual wafer production. For example, a tool that produced 150,000 wafers per year would cost <$450,000. Our structure design does not have a uniformity requirement that is need of the advanced controls offered by MOCVD and MBE. Thus, we can employ VPE/HVPE and take advantage of high deposition rates and throughput.

In an example, the buried emitter layer is formed via diffusion or other techniques. In an example, the buried emitter is described in co-pending application U.S. Provisional No. 61/718,708 filed Oct. 26, 2012, which is commonly assigned, and hereby incorporated by reference herein. In an example, the present technique uses employs a buried emitter, wherein, the Si-emitter is formed prior to deposition. In an example, rather than relying on the III-V semiconductor material as the source of diffused elements, e.g., GaP, to create the n-type emitter, processes disclosed herein rely on intentional diffusion of a III-V element under controlled circumstances or ion implantation for creating a buried emitter prior to epitaxial growth. Furthermore, such processes may incorporate various non-III-V elements to form a desired n-type emitter, while still being compatible with low-cost processes able to produce high-efficiency III-V on Si solar cells, such as a tandem cell. In an example, the buried emitter design also enables a method to form a p-type emitter within an n-type Si base wafer.

In an example, N-type recipe details are provided. For phosphorous diffusion into a p-type substrate in the III-V deposition chamber, we have the following recipes described below in reference to FIG. 13, which illustrates diffusion profiles of P in Si substrate. In an example, diffusion is performed in an MOCVD reactor at 100 mbar, although there can be variations. In an example, the method includes a pre deposition at 1100 C for 5 min in PH3 and H2 and drive-in at 1150 C for 1.5 min in H2. In an example, the blue curve shows the active n-type doping concentration. This was performed in less than 10 minutes, which still enables a high-throughput deposition process. Of course, there can be variations.

In an example, the buried emitter layer is formed via diffusion prior to loading the silicon wafer into the III-V deposition chamber. In some cases it may be preferred to do the diffusion prior to III-V deposition. In an example, the technique uses diffusion processes of conventional module production lines so that there are minimal changes to the bottom cell emitter profile compared to conventional techniques. Another benefit is that we then have the flexibility to maximize or improve the wafer throughput of the III-V deposition chamber by not doing diffusion in the chamber. In an example, a typical outside phosphorous diffusion occurs in the range of 850 C for approximately 30 minutes, and below is a typical emitter profile.

In an example, the buried emitter layer is formed via diffusion after loading the Silicon wafer into the III-V deposition chamber. It may be desired to do perform the diffusion in the same chamber as the III-V deposition if the additional time and expense for diffusions are less than the cost of performing diffusion in the module production line. In an example, the process is characterized by adding less than 10 minutes of total process time with minimal additional source cost, which is believe to eliminate the need for a silicon module production line to have diffusion furnaces. Therefore, the production floor space is configured with other equipment, such as a III-V deposition chamber.

In an alternative example, the buried emitter layer is formed via ion implantation. In an example, another way to provide an emitter structure in a generic tandem cell, such as a tandem cell, is to form the buried emitter through an ion implantation process prior to the epitaxial growth of the III-V semiconductor layers associated with the top cell. A materials engineering process, ion implantation involves the acceleration of ions of a particular element in an electrical field, and impacting a solid, thus resulting in a change of the physical and/or electrical properties of the solid. Consistent with low-cost production techniques currently employed in Si-based production, ion implantation may be used with the elements As, P, B, Ga, Sb, Al, In, and N to provide for a robust, buried emitter structure in a generic tandem cell. The element appropriate for ion implantation under the proper conditions may be selected through corresponding analysis of the solid solubility limits and projected implant ranges. Examples of implantation ranges can be found and described in FIGS. 3A, 3B, 3C, 3D, and 3E of the co-pending application U.S. Provisional No. 61/718,708 filed Oct. 26, 2012.

In an example, projected ranges for implants of various elements in Si, the projected range being defined herein as the distance from the surface where the implant concentration reaches its peak value. Depending on the stopping ranges and ion flux, the profile of the implant can be estimated at a particular ion energy. A curve depicts the projected range for boron, while a curve depicts the projected range for phosphorus, a curve depicts the projected range for Ga, a curve depicts the projected range for As, and a curve depicts the projected range for Sb.

In an example, the implant provides for profiles of P, As, and Sb in Si at 120 keV and an ion dose of 1E15 ions/cm$^3$. A curve depicts the implant profile of Sb, while a curve depicts the implant profile of As, and a curve depicts the implant profile of phosphorus. The profiles are in terms of concentration of the element versus depth, i.e., the depth within the Si wafer.

In an example, an ion implantation process for implanting As will be discussed in greater detail. Assuming a tandem cell, a curve representative of the implant profile for As in Si at 60 keV and a dose of 1E15 ions/cm$^3$. An n-type Si emitter results from the ion implantation process, and Ga and P diffused from the deposited GaP on the Si. A 1000° C. activation anneal for 1 minute may be needed after the implant step, but this will have little effect on the final As profile. Solid solubility limits for Ga, As, and P were taken into account in this example, and electrically active dopants in the growth conditions were assumed to be 44% for As, 55% for P, and 60% for Ga. The Si wafer is assumed to have a uniform p-type doping of 3E15 cm$^{-3}$.

In an example, a profile can be adjusted to provide a more stable, manufacturable device structure with optimal performance by employing a drive-in process. As an example, we will assume the use of a Rapid Thermal Annealing (RTA) system to perform a two minute drive-in at 1150° C. In this example, we assume the drive-in anneal activates the implant and that the epitaxial growth of the top cell has minimal impact on the As profile. The drive-in step will remove the transition region by driving additional As towards the interface between the emitter and the GaP and maintain a more constant electron concentration profile.

In an example, the tunnel junction region comprises doped Silicon layers. In an example, techniques include the tunnel junction entirely in silicon with an III-V cell on top is provided. As an example, silicon doping and/or layers within the tunnel junction are included. In an example, although silicon is an absorbing layer, a tunnel junction employing Si may be desirable in these types of structures since the very thin layer can have minimal absorption, while the narrow bandgap of the Si portion of the tunnel junction may enable lower tunneling resistance. These alternative designs provide additional flexibility to produce an optimal tunnel junction, with respect to an overall photovoltaic design, to provide the best tradeoff between absorption and low resistance. Additionally, because high doping concentration is important for achieving an abrupt junction, Si has a further advantage because it can be doped higher. Dopants tend to diffuse and compensate each other during subsequent processing steps, which can reduce the abruptness of the tunnel junction profile, and therefore having a higher doping concentration is also better in terms of manufacturing. The advantages of a tunnel junction employing Si should be properly balanced with the increased optical absorption associated with a lower bandgap material, such as Si. However, given the fact that the bottom cell, in a tandem cell solar cell configuration, absorbs wavelengths of light near infrared, Si TJ structures having thicknesses less than 100 nm should not lead to significant optical losses. Further details of the tunnel junction can be found in co-pending applicaton U.S. Provisional No. 61/718,708 filed on Oct. 26, 2012, which is incorporated by reference herein. In an example, the tunnel junction region contains a doped gallium and phosphorous bearing layer.

In an example, the contact layer is compatible with Silver and Copper-based contact schemes employed in Silicon-based foundry production. In an example, a desirable contact layer has a bandgap greater than the base layer (contact layer range would be 1.7-2.0 eV) and able to form ohmic contacts with a resistance (with standard Si-module contact schemes) of less than $10^{-4}$ ohm-cm$^2$. In addition, the contact layer might also serve as a lateral current transport layer for the front side electrode. In that case, it would be desirable to have a sheet resistance less than 500 ohms/square. Exemplary materials may include, but not be limited to, $In_{(x)}Al_{(y)}Ga_{(1-x-y)}P$, $GaAs_{(x)}N_{(y)}P_{(1-x-y)}$, GaP, ZnO, ITO. The material can be strained or unstrained, as long as it can be doped sufficiently high and enables the use of standard contacting schemes, such as screen-printing.

In an example, the photovoltaic devices described herein use materials that are compatible with screen-printing or other contact schemes used in Si-based photovoltaic manufacturing, including but not limited to plating and photolithography. For example, the photovoltaic devices disclosed herein are compatible with silver and copper based contacts, which are deposited via screen printing or plating. Contact layers may be required to allow formation of a low resistance contact between the metal grid and semiconductor and may or may not be etched between the fingers, depending on whether or not they are transparent. If etching is required, as part of a fabrication process, the etch chemistry for such contact layers should also be compatible with the various contact schemes described throughout the present specification.

In an example, GaAs contact layers, for example, have been used in the past, but are absorbing. A desirable contact layer may have a bandgap greater than 1.9 eV and be able to form ohmic contacts with a resistance of less than $10^{-4}$ ohm-cm$^2$. In addition, the contact layer might also serve as a lateral current transport layer for the front side electrode. In that case, it would be desirable to have a sheet resistance less than 500 ohms/square. Exemplary materials may include, but not be limited to, $In_{(x)}Al_{(y)}Ga_{(1-x-y)}P$, $GaAs_{(x)}N_{(y)}P_{(1-x-y)}$, GaP, ZnO, ITO. The material can be strained or unstrained, as long as it can be doped sufficiently high and enables the use of standard contacting schemes, such as screen-printing. An anti-reflective coating (ARC) or transparent conductive oxide (TCO) layer may then be optionally deposited through chemical vapor deposition or sputter deposition processes to complete the basic contact formation.

In an example, electroplating to thicken the grid and, prior to such thickening of the grid, a contact alloy may be required.

In an example, the contact layer has a bandgap greater than the bandgap of the base of the second active cell. That is, the base ranges of 1.7-1.9 eV, although there can be variations. So contact layer ranges from 1.8-2.0 eV. Since the contact layer would be non-absorbing in this case, it is preferred because we would not need to remove any contact layer material. Therefore, no additional process steps would be added to our module production process vs. standard Si-based module production processes.

In an example, the contact layer has a bandgap less than the bandgap of the base of the second active cell. We may have to use a narrower bandgap material to get good contacts. In that case, it is possible to use a material with a bandgap ranging from 1.1 eV-1.5 eV. In an example, the buried emitter region formation can be employed for either p-type or n-type emitters. In an example, N-type buried emitter recipe has been described in the previous specification.

Using a p-type emitter with an n-type base wafer may be desirable with module production lines that employ n-type silicon. N-type is often times used for high-efficiency silicon cells. The prior art method for emitter formation cannot form a p-type emitter because the Ga-profile from the GaP epitaxy cannot provide the proper diffusion profile. A P-type recipe to do an Al-diffusion in a III-V chamber 1417 is described below. It is also desirable to do a Boron-diffusion in a III-V chamber 1417 or a Boron-diffusion prior to III-V deposition. In other examples Ga can be included to make the region. Of course, there can be variations.

Figure 15:
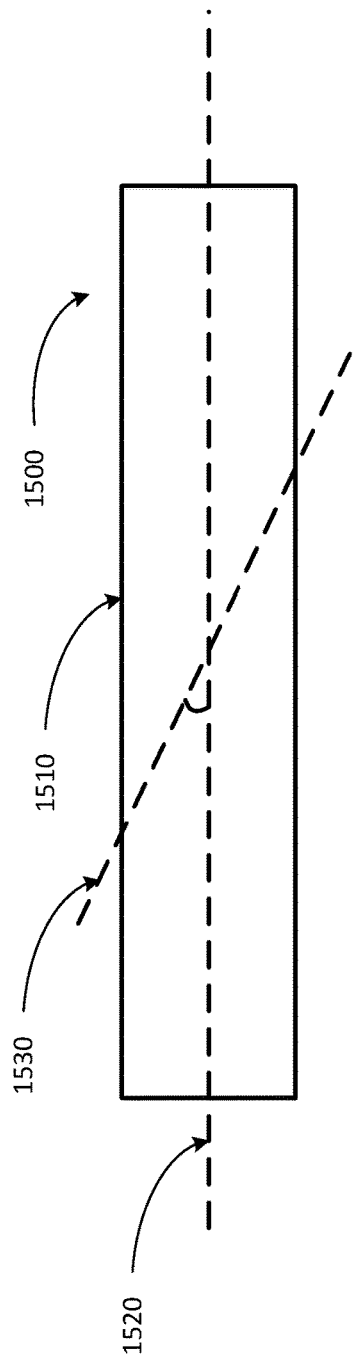
FIG. 15 shows an illustrative silicon substrate with a non-textured surface, primary orientation in the [100] crystal plane with an offcut 1530 towards the [111] crystal plane according to aspects of the disclosure.

In an alternative example, the present invention provides a method of fabricating a multi-junction monolithically integrated photovoltaic device using a Si-based module compatible process. In an example, the method includes providing a silicon substrate, the silicon substrate having a surface region. In an example, the silicon substrate 1500 of FIG. 15 is at a cost point to enable module production between 23 cents and $1.00 per watt with a non-textured surface 1510 and primary orientation 1520 in the [100] crystal plane with an offcut 1530 towards the [111] crystal plane ranging from 0.2 degrees to 10 degrees. The silicon substrate can be a standard solar grade wafer or a higher-quality, "semiconductor grade" wafer, provided the cost targets are achieved. In an example, the method includes providing a first active cell on the silicon substrate, the first active cell including a base. The base can be either n-type or p-type silicon, depending upon the efficiency and cost requirements for module production. The first active region base will comprise of the same material provided by the silicon substrate. Typically, n-type wafers and base regions are employed for the highest efficiency cells and modules, but p-type wafers and bases are employed for lower cost, lower efficiency cells and modules.

In an example, the method includes subjecting the first active cell region to thermal process to form a buried emitter region in the first active region and cause formation of first active cell comprising a first surface region. In an example, the buried emitter region is formed such that it can repeatedly be produced and enables an efficiency from 25%-37% after being subjected to the total thermal budget associated with formation of a second and/or third active region and subsequent Si-based module production processes. The buried emitter can have a thickness ranging from 50 nm to 700 nm with a doping profile that can range from $1E16\ cm^{-3}$ to $1E20\ cm^{-3}$. Rather than relying on the III-V semiconductor material as the source of diffused elements, e.g., GaP, to create the n-type emitter, the present method relies on intentional addition of an impurity/element under controlled circumstances to creating a buried emitter prior to depositing the second cell. Furthermore, such processes may incorporate elements to form a desired buried emitter, while still being compatible with low-cost processes able to produce high-efficiency III-V on Si solar cells. In an example, the silicon based solar cell can be provided from conventional manufacturers.

In an example, the method includes cleaning the first surface region to be substantially free from organic or metallic contaminants. The cleaning of the first surface region occurs in an environment that enables the removal of organic and metallic contaminants either by etching or desorb. This removal occurs prior to second cell formation and can be performed either outside (ex-situ) the deposition chamber, or in-situ. Ex-situ cleaning can employ multiple chemicals and conditions, including an HF-based solution. In-situ cleaning requires meeting the necessary temperature threshold to remove the native oxide as well as an ambient condition that allows for the surface to be free of substantial unintended doping or contamination of Ga, Al, In, Te, O, C, H, Si, As, P, N, Mg, Zn, B, or any other metallic or organic materials. In an example, the method includes forming a termination layer overlying the first surface region, the termination layer being a thickness of a gallium and phosphide bearing epitaxially formed material provided using a MOCVD process at a first temperature range and the thickness of the gallium and phosphide bearing epitaxial material characterized by a region having a threading dislocation density of $1\times10^5$ to $1\times10^7$ cm$^{-3}$ with a thickness ranging from 50 Å-1000 Å or preferably about 100 Å, although there can be variations. In an example, the method includes forming a tunnel junction region overlying the buried emitter region With the tunnel junction providing for current matching between the first and second active cells with resistances and optical losses low enough to enable cell efficiencies greater than 25%. The tunnel junction is preferably formed between the buried emitter of the first active cell and the second active cell. The tunnel junction can be contained entirely or partially within the silicon wafer or can be deposited on top of the silicon wafer prior to depositing the second active cell. The method includes forming a back surface region overlying the tunnel junction region that produces an electric field strength adequate to sweep carriers out of the base region for collection. In an example, the method includes forming a second active cell using a second temperature range overlying the back surface region. The second active cell includes a base and an emitter. The second active cell is formed from one or more III-V semiconductor layers and characterized by a threading dislocation density of $1\times10^5$ to $1\times10^7$ cm$^{-3}$; enabling adequate reliability for use in PV systems. In an example, the first active cell region and the second active cell region are characterized by a cell level efficiency of about 25% to 37%.

In an example, the present method uses silicon solar cells from one of a plurality of manufacturers, each having the same or different cell configurations. In an example, the providing of the silicon substrate, providing the first active cell on the silicon substrate, and subjecting the first active cell region to thermal process to form the buried emitter region in the first active region and cause formation of first active cell are provided from a manufacture of a solar cell having a contact pattern configured for a single junction solar module configured for the silicon cell or alternatively the present multi-junction monolithically integrated photovoltaic device. In this example, the method forms the second cell by performing the cleaning the first surface region to be substantially free from organic or metallic contaminants, forming the termination layer overlying the first surface region, forming the tunnel junction region overlying the buried emitter region, forming the back surface field region overlying the tunnel junction region, and forming the second active cell using the second temperature range overlying the back surface field region and thereafter forming a contact layer having the contact pattern overlying the back surface field region to compete the multi-junction device.

Figure 14:
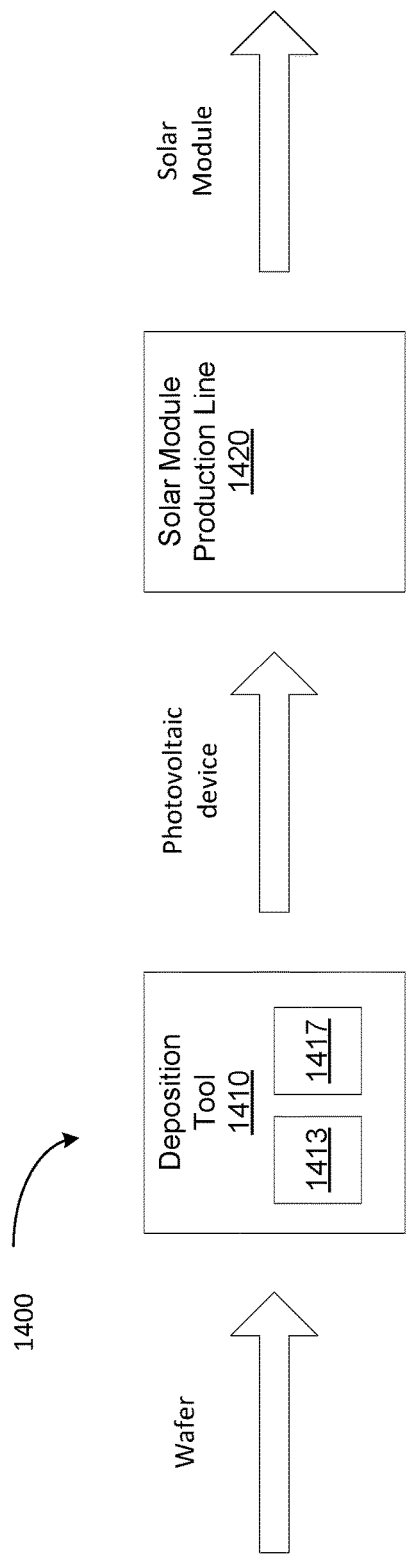
FIG. 14 shows an illustrative system for manufacturing a solar module according to aspects of this disclosure.

In an example, the present techniques include a lattice-matched termination layer that enables one or more material capabilities. In an example, a thin, low dislocation density III-V top cell can be deposited directly on a silicon wafer, which can be from a plurality of solar processes. In an example, the termination layer is characterized by a total deposition thickness between 0.5 μm and 1.5 μm, which is necessary to enable high-throughput and low cost top cell deposition processes that require only one deposition tool such as the deposition tool 1410 of FIG. 14 although there may be variations. In an example, our approach enables a scalable, low-cost structure that can more easily be employed in existing silicon-based cell and module production facilities.

In an example, the present method can be used with either p-type or n-type silicon wafers, employing existing emitter diffusion capabilities, or using various metallization schemes. In an example, our technique enables the use of standard silicon emitter formation processes to employ a silicon emitter in the bottom cell for both p-type and n-type wafers. In an example, our technique uses standard back-side contact schemes, which have been configured for a single junction module process for use with the present multi-junction configurations. In an example, compatibility with standard, silicon-based front contact schemes have been achieved. In volume production, this solution will enable us to provide a silicon cell or module facility a standard thickness, n-type of p-type silicon wafer with less than 1.5 µm of deposited top cell material on top of the silicon wafer. The silicon-based production facility would be able to "drop-in" this wafer to the production line and utilize the existing factory and equipment set to form the remainder of the final cell or module.

In an example, a top cell deposition tool 1410 would be placed on the production floor. Standard silicon wafers would come in to the factory and go through the standard emitter diffusion process. These wafers would be loaded into the top cell deposition chamber and the top cell would be deposited with a thermal budget appropriate to not adversely impact the final emitter diffusion profile. Wafers would be unloaded from the top cell deposition chamber and then undergo standard back-side and front-side production processes.

In one aspect, a method of fabricating a photovoltaic device is provided, the method including providing a silicon substrate, a first active cell on the silicon substrate, and a second active cell on the first active. The first active cell may include a base and an emitter region, and the second active cell may include a base and an emitter, the second active cell being formed from one or more III-V semiconductor layers. The buried emitter region of the first active cell may be formed through diffusion or ion implantation of one or more III-V elements. In certain embodiments the III-V elements include one selected from a group includes As, B, Ga, Sb, N, In, and Al, and may or may not also include P. In other embodiments, a temperature profile is taken into account during providing the first and second active cells, the temperature profile may also include temperature ranges during other subsequent fabrication processes. In still other embodiments, the temperature profile is selected to reduce diffusion of a III-V element, as part of providing the second active cell. In some embodiments, the base of the first active cell is a p-type base and the buried emitter region of the first active cell includes an n-type emitter, and the buried emitter region may be formed by diffusion. The diffusion may include diffusion of a III-V element selected from a group including As, N, and Sb, and may or may not include P. In other embodiments, the n-type buried emitter region of the first active cell is formed by ion implantation of a III-V element selected from a group including P, As, N, Sb, Al, In, B, and Ga. In certain other embodiments, the base of the first active cell is an n-type base and the buried emitter region of the first active cell includes a p-type emitter. The diffusion may include diffusion of a III-V element selected from a group including Ga, B, Al, and In. In still other embodiments, the p-type buried emitter region of the first active cell is formed by ion implantation of a group III element selected from one or more of Ga, B, Al, and In.

In still other embodiments, a first portion of the photovoltaic device may be fabricated in a silicon chamber 1413 and a second portion of the photovoltaic device may be fabricated in a III-V chamber 1417, and the first portion of the photovoltaic device may include the buried emitter region of the first active cell. The silicon chamber 1413 and the III-V chamber 1417 may be the same tool. In other embodiments, a delta-doped layer may be provided prior to the first active cell, and the delta-doped layer may include Ga or Al.

In another aspect, a method of fabricating a photovoltaic device includes providing a silicon substrate, a first active cell on the silicon substrate, and a second active cell on the first active cell, the second active cell formed from one or more III-V semiconductor layers. A base of the first active cell may include single crystal silicon or polycrystalline silicon. In certain embodiments, the silicon may include a crystalline orientation. The crystalline orientation may be equal to or less than 2 degrees off the (100) crystal axis. In other embodiments, the crystalline orientation may be (100), while in still other embodiments, the crystalline orientation may be greater than 2 degrees off the (100) crystal axis. In some embodiments, the silicon substrate is textured, while in other embodiments the silicon substrate includes a surface preparation employed for subsequent deposition. The silicon substrate may be suitable for use in a HIT cell, or may be a solar grade wafer, or may be a semiconductor grade wafer. In other embodiments, the silicon substrate includes kerf-free silicon.

In yet another aspect, a method of fabricating a photovoltaic device includes providing a silicon substrate, a first active cell on the silicon substrate, a second active cell on the first active cell, the second active cell including one or more III-V semiconductor layers, and a contact layer on the second active cell, the contact layer may be provided utilizing a contact scheme employed in a Si-based photovoltaic manufacturing process. In certain embodiments, the Si-based photovoltaic manufacturing process is screen-printing. In other embodiments, the contact layer is compatible with silver and copper based contacts, and the silver and copper based contacts may be provided via screen-printing or plating. In still other embodiments, the contact layer may be fabricated from material having a bandgap greater than 1.9 eV. In certain embodiments, the contact layer includes GaP, or includes $In_{(x)}Al_{(y)}Ga_{(1-x-y)}P$, or includes $GaAs_{(x)}N_{(y)}P_{(1-x-y)}$, or includes ZnO, or includes ITO. In other embodiments, a first contact electrically coupled to the contact layer is provided and a second contact electrically coupled to the base of the first active cell is provided. In some embodiments, the first contact is adjacent to the contact layer and the second contact layer is adjacent to the base of the first active cell, while in other embodiments, the first and second contacts are positioned adjacent to the contact layer, or adjacent to the base of the first active cell.

In another aspect, a method of fabricating a photovoltaic device includes providing a silicon substrate, a first active cell on the silicon substrate, the first active cell including a buried emitter region, where the buried emitter region is formed by diffusion of a III-V element selected from a group of III-V elements, the group of III-V elements not including P. In some embodiments, the group of III-V elements includes As, B, Ga, Sb, N, In, and Al. In other embodiments, the method further includes providing a second active cell on the first active cell, the second active cell being formed from one or more III-V semiconductor layers, the buried emitter region of the first active cell being created prior to providing the one or more III-V semiconductor layers of the second active cell. In still other embodiments, the base of the first active cell is a p-type base and the emitter region includes an n-type emitter, and the group of III-V elements includes As, N, and Sb. In yet other embodiments, the base of the first active cell is a n-type base and the emitter region includes a p-type emitter, and the group of III-V elements includes B, Ga, In, and Al.

In another aspect, a method of fabricating a photovoltaic device includes providing a silicon substrate, a first active cell on the silicon substrate, the first active cell including an n-type base and a p-type buried emitter region, and a second active cell on the first active cell, the second active cell including a base and an emitter, the second active cell formed from one or more III-V semiconductor layers. In some embodiments, the p-type buried emitter region of the first active cell is formed by diffusion of a group III element. The group III element may be selected from Ga, B, Al, and In. In yet other embodiments, the p-type buried emitter region of the first active cell is formed by ion implantation of a group III element. The group III element may be selected from Al, In, B, and Ga.

In yet another aspect, a method of fabricating a photovoltaic device includes providing a silicon substrate, a first active cell on the silicon substrate, the first active cell including a base and a buried emitter region, a second active cell on the first active cell, the second active cell being formed from one or more III-V semiconductor layers, the buried emitter region being formed by diffusion prior to providing the second active cell. In some embodiments, the diffusion includes the diffusion of a III-V element, and the III-V element may be selected from a group of III-V elements including As, B, Ga, Sb, N, In, and Al, and may or may not include P. In other embodiments, the base of the first active cell is a p-type base and the buried emitter region includes an n-type emitter, and the group of III-V elements includes As, N, and Sb. In other embodiments, the base of the first active cell is an n-type base and the buried emitter region includes a p-type emitter, and the group of III-V elements includes B, Ga, In, and Al.

In another aspect, a method of fabricating a photovoltaic device includes providing a silicon substrate, a first active cell on the silicon substrate, the first active cell including a base and a buried emitter region, and a second active cell providing on the first active cell, the second cell including one or more III-V semiconductor layers, the buried emitter region of the first active cell being formed by ion implantation, the buried region of the first active cell being formed prior to providing the second active cell. In certain embodiments, the ion implantation includes the implantation of a III-V element selected from a group of III-V elements including P, As, N, Sb, Al, In, B, and Ga. In other embodiments, the base of the first active cell is a p-type base and the buried emitter region of the first active cell includes an n-type emitter, and the III-V element may be selected from a group of III-V elements including P, As, N, and Sb. In still other embodiments, the base of the first active cell is an n-type base and the buried emitter region includes a p-type emitter, and the III-V element may be selected from a group of III-V elements including B, Ga, In, and Al. In certain embodiments, the method is compatible with silicon module production processes. In other embodiments, the method provides for dislocation densities low enough to achieve an efficiency greater than or equal to 25%.

In yet another aspect, a method of fabricating a photovoltaic device includes a silicon substrate, a first active cell on the silicon substrate, the first active cell including a base and a buried emitter region, a second active cell on the first active cell, the second active cell being formed from a plurality of III-V elements, a low thermal budget being employed to minimize diffusion of the plurality of III-V elements into the buried emitter region. In certain embodiments, the buried emitter region of the first active cell is formed prior to providing the second cell. In other embodiments, the buried emitter region is formed by diffusion of a III-V element, while in other embodiments the buried emitter region being formed by ion implantation of a III-V element. In yet other embodiments, the buried emitter region is formed by ion implantation of a III-V element, the III-V element may be As, and a drive-in step may also be provided to increase the As concentration between the buried emitter region and the second active cell.

In another aspect, a method of fabricating a photovoltaic device includes providing a silicon substrate, a first active cell on the silicon substrate, a second active cell on the first active cell, the second active cell including one or more III-V semiconductor layers, and a tunnel junction between the first and second active cells. In some embodiments, the tunnel junction is formed within the first active cell. In certain other embodiments, a first portion of the tunnel junction is formed within the first active cell and a second portion of the tunnel junction is formed within the second active cell, and the first portion of the tunnel junction may include silicon. In still other embodiments, the second portion of the tunnel junction includes GaP. In yet other embodiments, the tunnel junction includes $Al_{(x)}Ga_{(1-x)}As_{(1-y-z)}N_{(y)}P_{(z)}$. In other embodiments, the tunnel junction includes a first portion adjacent the first active cell and a second portion adjacent the second active cell, the first portion being a first polarity and the second portion being a second polarity different from the first polarity. In certain embodiments, the first portion may be n-type and the second portion may be p-type, while in other certain embodiments the first portion may be p-type and the second portion may be n-type.

In still another aspect, a method includes providing a contact layer upon a photovoltaic device, a metal on the contact layer, removing a portion of the contact layer, and providing a material upon the metal and a remaining portion of the contact layer to define a contact. In certain embodiments, the contact layer may have a bandgap less than 1.9 eV. In some embodiments, removing the portion of the contact layer is performed prior to providing the metal. In yet other embodiments, the metal is provided by plating or photolithography, or shadow mask evaporation. In still other embodiments, the contact layer is compatible with silver and copper based contacts, and the silver and copper based contacts may be deposited via screen-printing or plating. In certain embodiments, a resistance between the metal and the contact layer is less than $10^{-4}$ ohm-cm$^2$, and the contact layer may have a sheet resistance of less than 500 ohms per square. In some embodiments, the contact layer is strained, while in other embodiments, the contact layer is unstrained.

In yet another aspect, a method of fabricating a photovoltaic device includes providing a silicon substrate, a first active cell on the silicon substrate, a second active cell on the first active cell, the second active cell including one or more III-V semiconductor layers, and a plurality of contacts spaced a distance from each other. In some embodiments the distance is selected to balance shading loss of the plurality of contacts with the resistive loss of a sheet resistance of an emitter of the second active cell. In still other embodiments, the power loss attributed to shading loss of the plurality of contacts and the resistive loss of the sheet resistance on the second active cell may be calculated by a function in the form:

$$R_{loss} = j_{sc}^2 R_{sheet} \frac{l^2}{3} \left(\frac{\text{mW}}{\text{cm}^2}\right)$$

where 1 is the distance between each of the plurality of contacts and $R_{sheet}$ is the resistance per square for the emitter of the top active cell. In still other embodiments, an optimal value for the distance between each of the plurality of contacts occurs at a minimum of the function.

In still another aspect, a photovoltaic device includes a first active cell including a base and a buried emitter region, the base including silicon, and a second active cell including one or more III-V semiconductor layers, the buried emitter region of the first active cell being formed prior to the second active cell. In another aspect, a photovoltaic device includes substrate, a first active cell provided on the substrate, and a second active cell provided on the first active cell, the second active cell including one or more III-V semiconductor layers. In another aspect, a photovoltaic device includes a silicon substrate, a first active cell provided on the silicon substrate, and a second active cell provided on the first active cell, and a contact layer on the second active layer, the contact layer utilizing a contact scheme employed in Si-based photovoltaic manufacturing.

N-type buried emitter recipe was described above. Using a p-type emitter with an n-type base wafer may be desirable with module production lines 1420 that employ n-type silicon. N-type is often times used for high-efficiency silicon cells. The conventional method for emitter formation within the silicon wafer relied on diffusion from III-V materials deposited on the silicon prior to loading a substrate into a deposition chamber. The conventional method cannot form a p-type emitter because the Ga-profile from the GaP epitaxy is not able to provide the proper diffusion profile. As a result, the conventional method depends on depositing a III-V p-type emitter to serve as the bottom cell emitter, which must generally be deposited on top of the N-type Silicon bottom cell base wafer.

In an example, the present techniques include the top-cell emitter within the silicon wafer to enable a process that requires less III-V material deposition for lower cost and can also utilize existing, Si-module compatible production processes that are highly scalable and low cost. A P-type recipe to do an Al-diffusion in a III-V chamber 1417 is described below. It is also desirable to do a Boron-diffusion in a III-V chamber 1417 or a Boron-diffusion prior to III-V deposition.

In an example, the present method of manufacturing a multi-junction photovoltaic device is provided. The method includes providing a silicon based solar cell from a plurality of solar cells. Each of the solar cells can be from a different manufacturing process from a different manufacturer or the same manufacturer. The silicon based solar cell has a silicon substrate, a first active cell provided on the substrate, and a contact pattern to be provided and is compatible for a silicon based module process. That is, the solar cell, which is preferably in wafer form, can be provided from any one of a plurality of different manufacturers. The silicon based solar cell is functional and compatible for the silicon based module process and free from any overlying contact metallization, which will be applied after the overlying cell is grown. The silicon based solar cell is provided in wafer form, in an example. The method includes transferring the silicon based solar cell to an additional sequence of process operations for a second active region. The transferring can be to a different location or in the same geographic location. The method receives the solar cell, and forms a tunnel junction provided on the first active cell. The method includes forming the second active cell provided on the tunnel junction, which includes a first semiconductor layer and a second semiconductor layer, one of the first and second semiconductor layers including at least aluminum gallium phosphide, gallium phosphide, or aluminum phosphide, or others. The method includes forming a contact layer overlying the second active region using the multi-junction contact pattern compatible with the silicon based solar module process and providing the multi-junction photovoltaic device to the silicon based solar module process and using the multi-junction photovoltaic device in the silicon based solar module process to dispose the device along with a plurality of other devices on a substrate, and thereafter disposing a cover on the plurality of devices, and laminating the entirety to form a module having the plurality of devices. The method then outputs the module including the multi-junction photovoltaic device using the contact pattern. Of course, there can be variations.

In an example, formation of an emitter structure upon a p-type Si wafer, e.g. a Si base, employ intentional diffusion or ion implantation and an optional low thermal budget process. Although the emitter is not ideal, n-type, non-buried emitters can be formed within a p-type Si wafer by utilizing the natural diffusion profile of P and Ga that are supplied by the GaP deposited on the Si layer. However, the diffusion profiles of these elements preclude one from producing any emitter within the Si wafer. Therefore, an epitaxial grown p-type emitter that is either a III-V material or Si is desirably employed. For formation of a p-type Si emitter within a n-type Si substrate, an alternative process is desired.

In an example, a p-type emitter upon an n-type Si base may be formed through a diffusion or ion implantation process prior to the epitaxial deposition process. While any suitable element may be employed, certain elements may be employed which are compatible with low cost Si-based production processes. Such elements, for example, may include Ga, B, Al, or Indium. As an example for illustration purposes only, an emitter may be formed through a diffusion process employing Al. In an example, Ga-doped Si emitters may also be employed since Ga-doped Si may have superior reliability in Si-based photovoltaic modules. Ga doping has improved Light-induced degradation (LID) characteristics when compared with traditional Boron-doped Si bases, and so it may also be a desirable emitter dopant.

Additionally, the diffusion or implant processes discussed or described herein must account for the proper total thermal budget during the deposition of the III-V semiconductor materials, for formation of the top cell, and subsequent module production steps to provide the correct emitter thickness and a controllable, repeatable profile. Since phosphorus diffuses more readily into Si than Ga, to form a p-type Ga emitter, enough Ga must be diffused or implanted to compensate for any excess P-diffusion.

In some Si-module production processes, temperatures as high as 900-950° C. can be employed in an example, although such temperatures can be higher or lower. These high temperatures and Si-module thermal cycles should be considered in the design and manufacturability of the emitter region. Standard tools and temperatures commonly available in III-V production may be employed. Alternatively, Si-based production techniques may be employed. For example, a standard, low-cost, high volume Si-based epitaxy production may be employed to provide an epitaxially grown Si emitter on Si base substrates to form template wafers. The resulting template wafers may then be loaded into a III-V production tool for deposition of the remaining structure. Additionally, a layer could potentially be deposited on the Si surface that could provide a simpler nucleation for subsequent III-V deposition. It is also possible that a Si BSF could also be deposited in the Si-based tool prior to loading into the III-V tool. A dual-chamber system may be employed that has the ability to perform both Si and III-V based epitaxy without switching between different epitaxy tools.

In accordance with this disclosure, one has the ability to employ a growth process that occurs at low enough growth temperatures and short enough growth times to minimize any diffusion of elements from the epitaxy into the Si. Using such a III-V deposition process is desirable because it will be a higher throughput, lower cost process. In addition, by eliminating the diffusion of elements from the deposited III-V material into the Si wafer, a more controllable and repeatable profile will result. Conventional methods to form the emitter with P diffusion into the Silicon wafer from deposited III-V materials are incompatible with high throughput, low thermal budget III-V deposition processes.

To potentially compensate for elements diffused from the deposited III-V layers, delta-doping can be employed at the Si substrate surface. In addition, such a delta-doping process may be employed to form all or part of a tunnel junction layer.

The emitter design should also take into account the nucleation and buffer layer formation to achieve high quality layers on Si. To make the solar cell structure work, the thickness of the nucleation and buffer layers need to be thin and still have low dislocation densities. The dislocation density, for example, may be less than 1E6 cm−3. Of course, there can be variations.

While the embodiments have been described in conjunction with several specific examples, it is evident to those skilled in the art that many further alternatives, modifications and variations will be apparent in light of the foregoing description. In an example, the present silicon based solar cell can be high-grade solar cell, although other examples of silicon material such as polysilicon or amorphous silicon can be used, along with other thin films, such as CdTe, CIGS/CIS, and others. Thus, the embodiments described herein are intended to embrace all such alternatives, modifications, applications and variations as may fall within the spirit and scope of the appended claims.

What is claimed is:

1. A device comprising:
   a silicon substrate;
   a first active cell including at least part of the silicon substrate;
   a back-surface field layer located above the first active cell;
   a second active cell located above the back-surface field layer; and
   a tunnel junction comprising a first portion and a second portion, the first portion formed within the silicon substrate, the second portion formed above the silicon substrate, the tunnel junction being located between the first active cell and the back-surface field layer.

2. The device of claim 1, wherein the first active cell comprises silicon.

3. The device of claim 1, wherein the second active cell comprises GaP.

4. The device of claim 1, wherein the second portion of the tunnel junction comprises $Al_{(x)}(Ga_{(1-x)}As_{(1-y-z)}N_{(y)}P_{(z)}$.

5. The device according to claim 1,
   wherein the back-surface field layer comprises $Al_{(1-Z2)}Ga_{Z2}As_{(1-X2-Y2)}P_{(X2)}$.

6. A device comprising:
   a silicon substrate;
   a first active cell including at least part of the silicon substrate;
   a second active cell located above the first active cell;
   a back-surface field layer located above the second active cell; and
   a tunnel junction located between the second active cell and the back-surface field layer.

7. The device of claim 6, wherein the tunnel junction comprises $Al_{(x)}Ga_{(1-x)}As_{(1-y-z)}N_{(y)}P_{(z)}$.

8. The device of claim 6, further comprising:
   a third active cell located above the back-surface field layer.

9. The device according to claim 6, wherein the back-surface field layer comprises $Al_{(1-Z2)}Ga_{Z2}As_{(1-X2-Y2)}N_{(Y2)}P_{(X2)}$.

10. A device comprising:
    a silicon substrate;
    a first active cell including at least part of the silicon substrate;
    a back-surface field layer;
    a second active cell located above the back-surface field layer; and
    a tunnel junction comprising a first portion and a second portion, the first portion of the tunnel junction is closer to the first active cell than to the back-surface field layer,
    wherein the second portion of the tunnel junction is closer to the back-surface field layer than to the first active cell, and
    wherein the second portion having a polarity that is different from a polarity of the first portion.

11. The device of claim 10, wherein the first portion is n-type and the second portion is p-type.

12. The device of claim 10, wherein the first portion is p-type and the second portion is n-type.

13. The device of claim 10, wherein the second portion comprises GaP.

14. The device of claim 10, wherein the tunnel junction comprises $Al_{(x)}Ga_{(1-x)}As_{(1-y-z)}N_{(y)}P_{(z)}$.

15. The device according to claim 10,
    wherein the back-surface field layer comprises $Al_{(1-Z2)}Ga_{Z2}As_{(1-X2-Y2)}N_{(Y2)}P_{(X2)}$.

16. A method of fabricating a device, comprising:
    providing a silicon substrate;
    forming a first active cell in a portion of the silicon substrate;
    forming at least a portion of a tunnel junction in a surface of the silicon substrate;
    forming a back-surface field layer above the tunnel junction; and
    forming a second active cell above the back-surface field layer, the second active cell comprising at least one III-IV semiconductor and layer.

17. The method of claim 16, wherein the tunnel junction comprises $Al_{(x)}Ga_{(1-x)}As_{(1-y-z)}N_{(y)}P_{(z)}$.

18. The method according to claim 16, wherein forming the back-surface field layer comprises forming the back-surface field of $Al_{(1-Z2)}Ga_{Z2}As_{(1-X2-Y2)}N_{(Y2)}P_{(X2)}$.

* * * * *